United States Patent
Koyama et al.

(10) Patent No.: US 11,594,855 B2
(45) Date of Patent: Feb. 28, 2023

(54) SEMICONDUCTOR LASER DRIVE CIRCUIT, METHOD FOR DRIVING SEMICONDUCTOR LASER DRIVE CIRCUIT, DISTANCE MEASURING APPARATUS, AND ELECTRONIC APPARATUS

(71) Applicant: SONY CORPORATION, Tokyo (JP)

(72) Inventors: Takahiro Koyama, Kanagawa (JP); Tomoki Ono, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 289 days.

(21) Appl. No.: 16/758,621

(22) PCT Filed: Aug. 16, 2018

(86) PCT No.: PCT/JP2018/030385
§ 371 (c)(1),
(2) Date: Apr. 23, 2020

(87) PCT Pub. No.: WO2019/087524
PCT Pub. Date: May 9, 2019

(65) Prior Publication Data
US 2021/0184426 A1  Jun. 17, 2021

(30) Foreign Application Priority Data
Nov. 2, 2017  (JP) .............................. JP2017-212683

(51) Int. Cl.
*H01S 5/06* (2006.01)
*H01S 5/042* (2006.01)
(Continued)

(52) U.S. Cl.
CPC ............ *H01S 5/0427* (2013.01); *G01S 7/484* (2013.01); *G01S 17/10* (2013.01); *H01S 5/0428* (2013.01);
(Continued)

(58) Field of Classification Search
CPC .. H01S 5/0265; H01S 5/0615; H01S 5/06253; H01S 5/0658; H01S 5/0428
See application file for complete search history.

(56) References Cited

U.S. PATENT DOCUMENTS 1,251,775 A * 1/1918 Cysler ....................... B60S 1/44
                                                                15/250.24
5,014,280 A * 5/1991 Sanada .................. H01S 5/0625
                                                                372/50.1
(Continued)

FOREIGN PATENT DOCUMENTS

CA      2729088 A1 *  7/2012  ........... G02F 1/0327
CN      2917038 Y *  6/2007
(Continued)

OTHER PUBLICATIONS

International Search Report and Written Opinion of PCT Application No. PCT/JP2018/030385, dated Nov. 13, 2018, 08 pages of ISRWO.
(Continued)

*Primary Examiner* — Tod T Van Roy
(74) *Attorney, Agent, or Firm* — Chip Law Group

(57) ABSTRACT

A semiconductor laser drive circuit includes: an anode electrode divided into at least one gain region and at least one light absorption region; a cathode electrode shared between the gain region and the light absorption region; and a resistance connected to the anode electrode of the light absorption region.

12 Claims, 16 Drawing Sheets

(51) Int. Cl.

| | | |
|---|---|---|
| *G01S 7/484* | (2006.01) | |
| *G01S 17/10* | (2020.01) | |
| *H01S 5/0625* | (2006.01) | |
| *G01S 17/931* | (2020.01) | |
| *H01S 5/02212* | (2021.01) | |
| *H01S 5/02216* | (2021.01) | |
| *H03K 17/687* | (2006.01) | |

(52) U.S. Cl.
CPC ......... *H01S 5/0601* (2013.01); *H01S 5/0615* (2013.01); *H01S 5/06253* (2013.01); *G01S 17/931* (2020.01); *H01S 5/02212* (2013.01); *H01S 5/02216* (2013.01); *H03K 17/687* (2013.01)

(56) References Cited

U.S. PATENT DOCUMENTS

| | | | | |
|---|---|---|---|---|
| 5,185,756 | A * | 2/1993 | Olshansky | H04B 10/2914 372/38.1 |
| 5,706,117 | A * | 1/1998 | Imai | G02F 1/0123 372/29.02 |
| 6,044,097 | A * | 3/2000 | Kawamura | H01S 5/0427 372/38.01 |
| 9,088,122 | B2 * | 7/2015 | Moto | H01S 5/0085 |
| 10,587,092 | B2 * | 3/2020 | Ono | H01S 5/0428 |
| 10,680,406 | B2 * | 6/2020 | Ono | H01S 5/1017 |
| 11,329,450 | B2 * | 5/2022 | Nakamura | H01S 5/34326 |
| 11,329,451 | B2 * | 5/2022 | Pannwitz | G01S 17/931 |
| 2002/0006141 | A1 * | 1/2002 | Ogura | H01S 5/06255 372/18 |
| 2002/0064353 | A1 * | 5/2002 | Yokoyama | G02B 6/4215 385/88 |
| 2003/0057456 | A1 * | 3/2003 | Wada | H01S 5/04256 257/222 |
| 2003/0185257 | A1 * | 10/2003 | Suzuki | H01S 5/042 372/50.1 |
| 2007/0127534 | A1 * | 6/2007 | Shimamura | H01S 5/0265 372/46.015 |
| 2008/0174856 | A1 | 7/2008 | Matsuda et al. | |
| 2013/0016745 | A1 * | 1/2013 | Moto | H01S 5/0428 372/29.011 |
| 2013/0235710 | A1 | 9/2013 | Maruyama et al. | |
| 2014/0160745 | A1 | 6/2014 | Mandelboum et al. | |
| 2016/0344156 | A1 | 11/2016 | Rothberg et al. | |
| 2017/0085057 | A1 * | 3/2017 | Barnes | H01S 5/0428 |
| 2018/0054039 | A1 | 2/2018 | Watanabe et al. | |
| 2019/0173262 | A1 * | 6/2019 | Ono | H01S 5/0206 |
| 2019/0181608 | A1 * | 6/2019 | Ono | H01S 5/0265 |
| 2020/0076159 | A1 * | 3/2020 | Choi | H01S 5/06255 |
| 2020/0321748 | A1 * | 10/2020 | Pannwitz | G01S 17/931 |
| 2021/0184426 | A1 * | 6/2021 | Koyama | H01S 5/0427 |
| 2021/0203130 | A1 * | 7/2021 | Zhang | H01S 5/0625 |

FOREIGN PATENT DOCUMENTS

| | | | |
|---|---|---|---|
| CN | 103310811 | A | 9/2013 |
| DE | 10157439 | A1 | 6/2002 |
| EP | 0362078 | A2 | 4/1990 |
| EP | 1174966 | A2 | 1/2002 |
| EP | 3273551 | A1 | 1/2018 |
| JP | 56-066082 | A | 6/1981 |
| JP | 01-179480 | A | 7/1989 |
| JP | 01251775 | A * | 10/1989 ........... H01S 5/0265 |
| JP | 02-168691 | A | 6/1990 |
| JP | 07-202324 | A | 8/1995 |
| JP | 10-229252 | A | 8/1998 |
| JP | 11-046032 | A | 2/1999 |
| JP | 2002-033548 | A | 1/2002 |
| JP | 2002-164614 | A | 6/2002 |
| JP | 2003-098492 | A | 4/2003 |
| JP | 2003298175 | A | 10/2003 |
| JP | 2008-181930 | A | 8/2008 |
| JP | 2012-156458 | A | 8/2012 |
| JP | 2013-187234 | A | 9/2013 |
| JP | 2021-501476 | A | 1/2021 |
| JP | 2021501476 | A | 1/2021 |
| WO | 2014/093259 | A1 | 6/2014 |
| WO | 2016/147512 | A1 | 9/2016 |
| WO | 2016/187564 | A1 | 11/2016 |
| WO | 2018/037747 | A1 | 3/2018 |
| WO | WO-2021100644 | A1 * | 5/2021 |

OTHER PUBLICATIONS

Office Action for JP Patent Application No. 2019-549878 dated Jul. 19, 2022, 04 pages of English Translation and 04 pages of Office Action.

* cited by examiner

41

42

SEMICONDUCTOR LASER DRIVE CIRCUIT, METHOD FOR DRIVING SEMICONDUCTOR LASER DRIVE CIRCUIT, DISTANCE MEASURING APPARATUS, AND ELECTRONIC APPARATUS

CROSS REFERENCE TO RELATED APPLICATIONS

This application is a U.S. National Phase of International Patent Application No. PCT/JP2018/030385 filed on Aug. 16, 2018, which claims priority benefit of Japanese Patent Application No. JP 2017-212683 filed in the Japan Patent Office on Nov. 2, 2017. Each of the above-referenced applications is hereby incorporated herein by reference in its entirety.

TECHNICAL FIELD

The present disclosure relates to a semiconductor laser drive circuit, a method for driving the semiconductor laser drive circuit, a distance measuring apparatus, and an electronic apparatus.

BACKGROUND ART

Semiconductor laser devices like the one disclosed in Patent Document 1 have been suggested. A semiconductor laser device may be applied to various apparatuses, such as a distance measuring apparatus (a ranging apparatus) that measures the distance to the measurement object, for example.

CITATION LIST

Patent Document

Patent Document 1: Japanese Patent Application Laid-Open No. 10-229252

SUMMARY OF THE INVENTION

Problems to be Solved by the Invention

In the field of such circuits for driving semiconductor lasers (semiconductor laser drive circuits), there is a demand for a circuit configuration that is as simple as possible and excels in controllability.

Therefore, one objective of the present disclosure is to provide a semiconductor laser drive circuit having a circuit configuration that is simple and excels in controllability, a method for driving the semiconductor laser drive circuit, a distance measuring apparatus, and an electronic apparatus.

Solutions to Problems

The present disclosure is a semiconductor laser drive circuit that includes:

an anode electrode divided into at least one gain region and at least one light absorption region;

a cathode electrode shared between the gain region and the light absorption region; and a resistance connected to the anode electrode of the light absorption region, for example.

The present disclosure is a semiconductor laser drive circuit that includes:

an anode electrode divided into at least one gain region and at least one light absorption region; and a cathode electrode shared between the gain region and the light absorption region, in which a switching element connected between the cathode electrode and a ground is turned on or off, to modulate a laser output, for example The present disclosure is a method for driving a semiconductor laser drive circuit that includes: an anode electrode divided into at least one gain region and at least one light absorption region; and a cathode electrode shared between the gain region and the light absorption region, the method including turning on or off a switching element connected between the cathode electrode and a ground, to modulate a laser output, for example.

The present disclosure is a distance measuring apparatus that includes:

a semiconductor laser device including the semiconductor laser drive circuit described above;

a light reception unit that receives light reflected by an object that reflects laser light emitted from the semiconductor laser device; and an arithmetic unit that acquires a distance to the object, on the basis of the timing of emission and the timing of reception of the laser light, for example.

The present disclosure may be an electronic apparatus including the distance measuring apparatus.

Effects of the Invention

According to at least one embodiment of the present disclosure, it is possible to provide a semiconductor laser drive circuit or the like having a circuit configuration that is simple and excels in controllability. Note that the effects of the present technology are not limited to the effects described herein, and may include any of the effects described in the present disclosure. Further, the contents of the present disclosure should not be interpreted in a restrictive manner on the basis of the effects described as example effects herein.

MODES FOR CARRYING OUT THE INVENTION

Figure 1A:
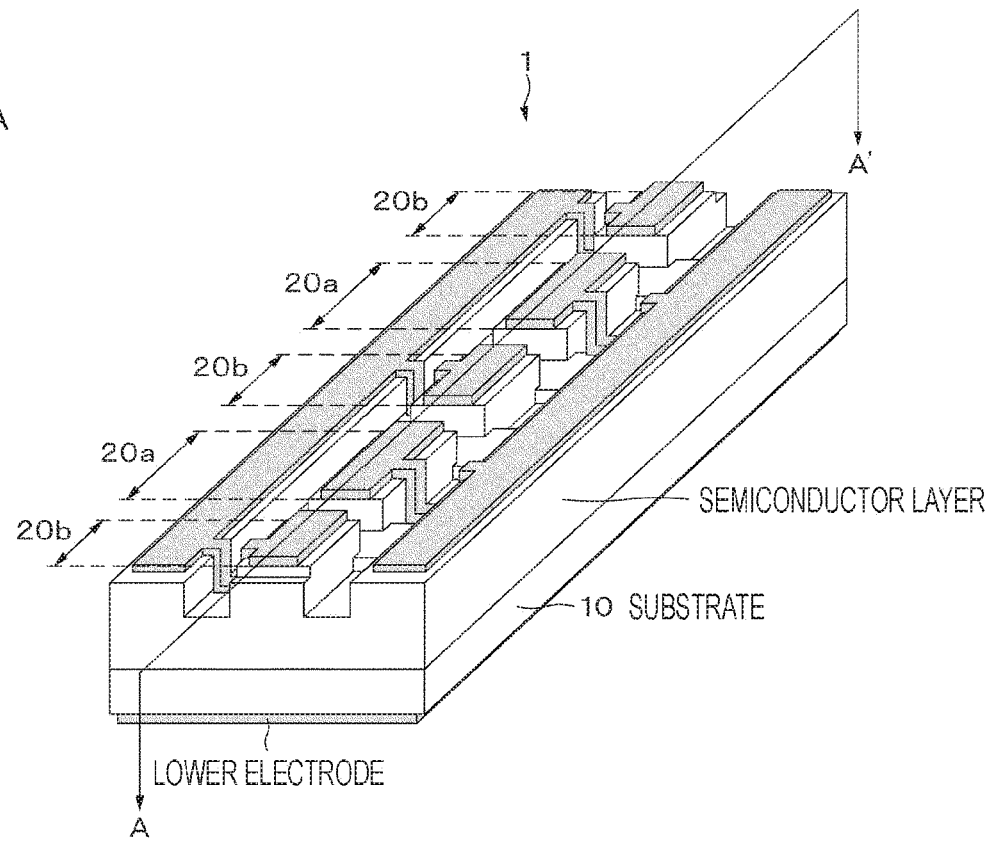
FIGS. 1A and 1B are diagrams schematically showing an example configuration of a Q-switched semiconductor laser according to an embodiment of the present disclosure.

The following is a description of embodiments and the like of the present disclosure, with reference to the drawings. Note that explanation will be made in the following order.

<General Explanation of the Technology>
<1. First Embodiment>
<2. Second Embodiment>
<3. Third Embodiment>
<4. Fourth Embodiment>
<5. Modifications>
<6. Example Applications>

The embodiments and the like described below are preferred specific examples of the present disclosure, and the contents of the present disclosure are not limited to these embodiment and the like.

<General Explanation of the Technology>

Prior to a description of embodiments of the present disclosure, a general technology in the technical field to which the embodiments belong is explained to facilitate understanding of each embodiment.

Known methods for obtaining light with short pulses (short-pulse light) in a laser device include pulse excitation methods, Q-switch methods, mode synchronization methods, and the like. To generate sub-nanosecond pulsed light, the Q-switch method (a method disclosed in Patent Document 1, for example) is often used.

A Q-switch method is a method for causing laser oscillation by continuing excitation while increasing light loss of a laser resonator to reduce oscillation, and rapidly reducing the light loss of the resonator at the point of time when the number of excited carriers in the laser medium becomes sufficiently large. In other words, the Q-value of the resonator is instantaneously increased, so that high-intensity pulsed light is obtained.

The Q-switch methods include passive types using saturable absorbers, and active types that actively control absorption rates. A Q-switched laser of a passive type has the advantage of being formed with a relatively simple structure. However, such a Q-switched laser of a passive type has drawbacks that self-excited oscillation often remains in pulsed light, and the timing of generation of pulsed light cannot be actively controlled. Therefore, the strength of such a Q-switched laser does not become sufficiently high. On the other hand, a Q-switched laser of an active type can actively control the timing of generation of pulsed light, and can compensate for the drawbacks of a Q-switched laser of a passive type. However, the device configuration including a drive circuit becomes more complicated, and there are disadvantages in terms of controllability, size, and cost. Therefore, it is desirable to appropriately set a circuit configuration from these viewpoints.

According to a Q-switch method in a semiconductor laser, a light absorption region is provided in a resonator formed by opposing end surfaces formed by cleavage or the like. When a voltage is applied in the forward direction to a pn junction of the semiconductor laser, a forward current flows, and spontaneous light emission is obtained. Since the refractive index of an active layer is higher than the refractive index of a cladding layer, light is confined in a vertical direction in the vicinity including the active layer, and is confined in a horizontal direction in the vicinity including the lower part of a ridge by a ridge structure. The generated light propagation mode reciprocates in the resonator having mirrors on both end surfaces of the ridge structure. At this point of time, the light induces emission transitions of other electrons in an excited state, leading to stimulated emission. The number of photons is increased while reciprocating in the resonator, and laser oscillation occurs when the gain exceeds the loss.

When a reverse voltage is applied to the pn junction (PN junction) of the semiconductor laser, light absorption increases in the active layer. At this point of time, photovoltaic power is generated at the PN junction, and a photovoltaic current flows in the reverse direction. In a semiconductor Q-switched laser, the properties of light absorption caused by application of a reverse bias is used as a Q-switch.

The light absorption characteristics of the light absorption region while a reverse bias is being applied derive from various factors. Light absorption increases due to a decrease in the bandgap of an active layer (a quantum well, for example), an increase in the probability of tunneling from the quantum well to an adjacent layer, or the like. On the other hand, the carrier densities in a p-layer and an n-layer are increased by photoexcitation. Therefore, in a case where the anode and the cathode are not connected, the potential difference applied to the PN junction by the optical carriers becomes smaller, resulting in a decrease in absorption. Accordingly, connecting the anode and the cathode can reduce the decrease in absorption. Further, if a resistance is inserted in a closed circuit between the anode and the cathode, the potential difference applied to the PN junction can be reduced with a voltage drop. Furthermore, if the time constant of the closed circuit is made greater, the photovoltaic current can be reduced. A structure in which the light absorption characteristics of a light absorption region changes transiently due to light generated in a gain region is normally called a passive type. In a structure of an active type, on the other hand, the light absorption characteristics of a light absorption region are directly modulated by a drive circuit.

1. First Embodiment

[Example Configuration of a Semiconductor Laser]

Figure 1B:
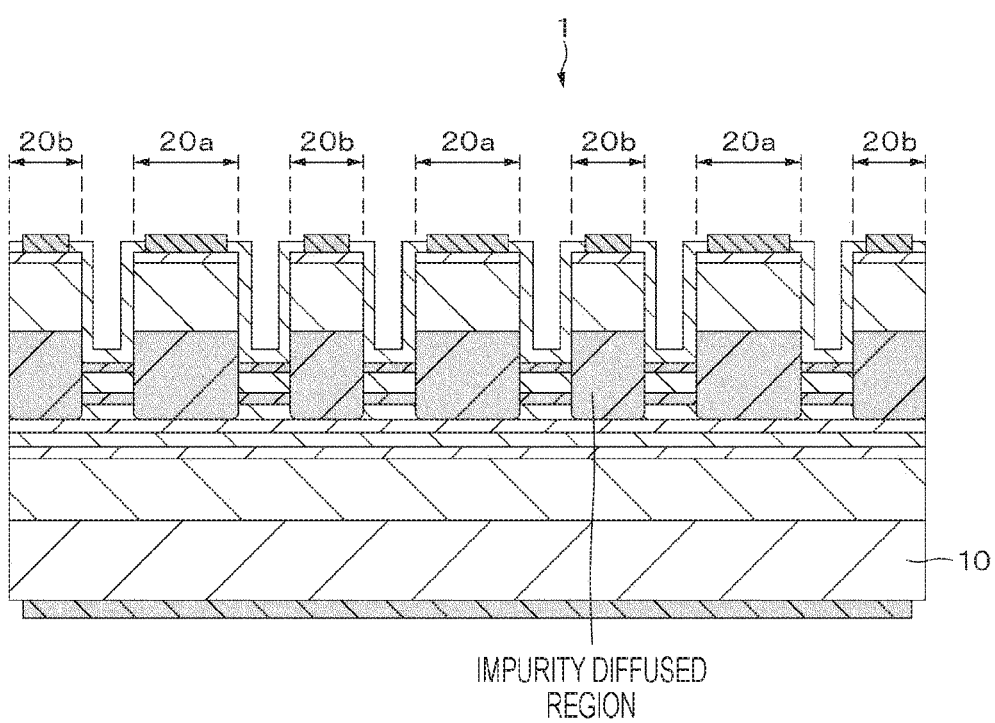

FIGS. 1A and 1B schematically show an example structure of a Q-switched semiconductor laser (a semiconductor laser 1) according to a first embodiment. FIG. 1A is a perspective view of the semiconductor laser 1. FIG. 1B is a cross-sectional view of the semiconductor laser 1 taken along the line A-A' defined in FIG. 1A.

The semiconductor laser 1 divides a p-type semiconductor layer formed on an n-type semiconductor substrate 10 through epitaxial growth or the like and an anode electrode formed on the p-type semiconductor layer into at least two regions. At least one of the regions is a gain region 20a that serves as a gain medium, and at least one of the other regions is a light absorption region denoted by reference numeral 20b. In other words, the anode electrode of the semiconductor laser according to this embodiment is divided into at least one gain region and at least one light absorption region. The light absorption region has a variable light absorption rate, and functions as a Q-switch region. Accordingly, in the description below, the light absorption region will be referred to as the Q-switch region 20b, where appropriate.

Note that the applicant has suggested Japanese Patent Application No. 2016-164934 as a configuration in which the anode electrode is divided into a gain region and a Q-switch region, and the matters disclosed in the application can be applied to the present disclosure. Although the cathode electrode of the semiconductor laser 1 may be separated into two or more regions, it is necessary to electrically connect the divided electrodes to obtain the cathode common electrical characteristics described later. Note that the example structure of the semiconductor laser 1 described above is also applied to other embodiments.

[Problem to be Considered in Driving a Semiconductor Laser]

Figure 2:
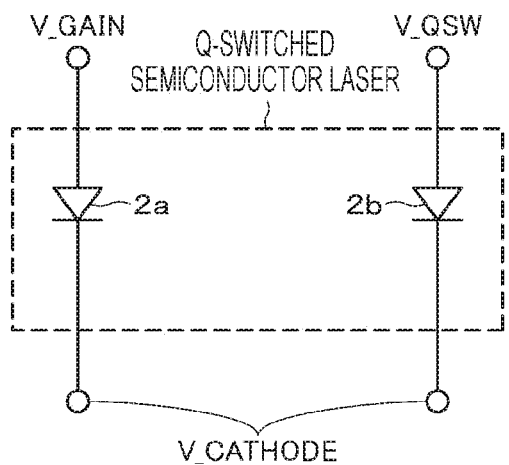
FIG. 2 is a diagram showing an equivalent circuit of a drive circuit that drives a general Q-switched semiconductor laser.

Here, the problem to be considered in driving a semiconductor laser in which the anode electrode is divided into a gain region and a Q-switch region (this semiconductor laser will be hereinafter also referred to as a Q-switched semiconductor laser as appropriate) will be described. FIG. 2 shows the most simplified equivalent circuit of a semiconductor laser having such a configuration. The anode in a gain region 2a and the anode in a Q-switch region 2b are independent of each other, and the cathodes are also independent of each other. A pulse voltage V_GAIN (hereinafter abbreviated as V_GAIN, where appropriate) having a peak voltage of several V (volts) and a pulse width of sub-nanoseconds to several nanoseconds is applied to the anode in the gain region 2a, for example. On the other hand, a pulse voltage V_QSW (hereinafter referred to simply as V_QSW, where appropriate) having a peak of 0 V to several V with a base potential difference of negative several V from the cathode, and a pulse width of sub-nanoseconds to several nanoseconds is applied to the anode in the Q-switch region 2b, for example.

Figure 3:
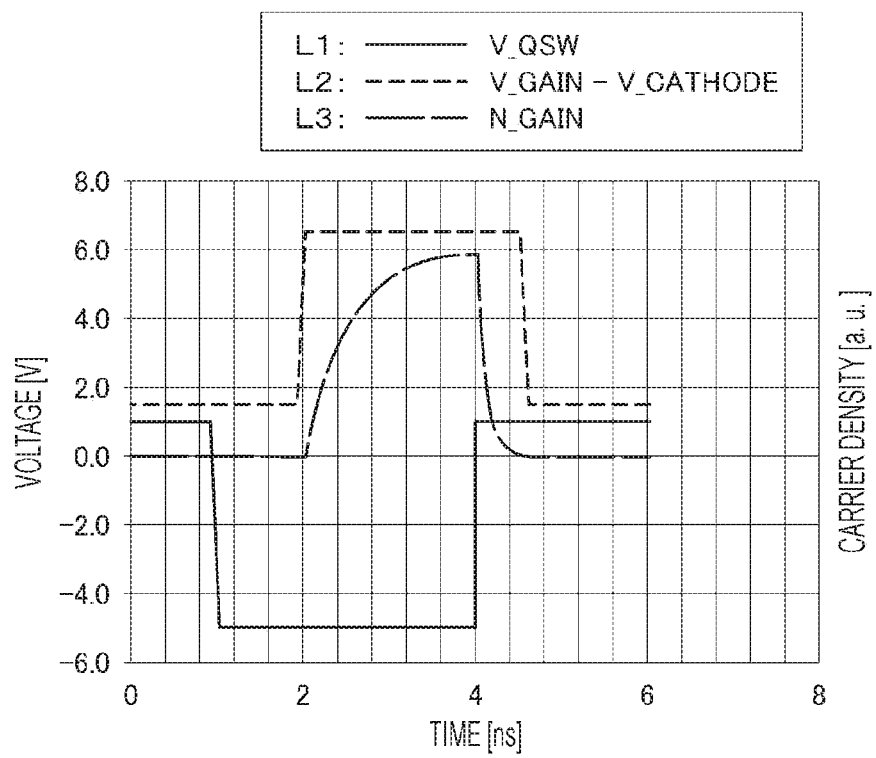
FIG. 3 is a diagram for explaining an example operation of a drive circuit that drives a general Q-switched semiconductor laser.

Next, an example of time responses of V_GAIN and V_QSW is described, with reference to the graph shown in FIG. 3. In the graph in FIG. 3, the abscissa axis indicates time (nanosecond (ns)), and the ordinate axis indicates voltage (volt (V)) or carrier density (unit (a.u.)). Further, in the graph in FIG. 3, line L1 represents the temporal change of V_QSW, line L2 represents the temporal change of (V_GAIN-V_CATHODE), which is the difference between V_GAIN and the voltage V_CATHODE on the cathode side, and line L3 represents the temporal change of the carrier density N_GAIN in the active layer in the gain region 2a.

V_QSW is a base state in which the potential difference from the cathode is several V on the negative side, and V_GAIN is applied. In the Q-switch region 2b, the light absorption rate is high, the light absorption coefficient of the semiconductor laser resonator is high, and thus, laser oscillation due to application of V-GAIN is restricted. Accordingly, spontaneous emission is dominant in the radiation recombination of the active layer due to the pulse voltage applied to the gain region 2a. The time constant of spontaneous emission is several nanoseconds, and the carrier density N_GAIN in the active layer in the gain region 2a starts to gradually increase at the timing of application of V-GAIN and saturates in several nanoseconds.

At a timing before or after saturation, V QSW is rapidly changed from zero V to several V. The light absorption of the Q-switch region 2b rapidly decreases, and as a result, the light absorption coefficient of the semiconductor laser resonator drops instantaneously and becomes transparent, to induce laser oscillation. The carrier density N_GAIN of the active layer in the gain region 2a is much higher than the transparent carrier density, and excessive carriers are instantaneously recombined by stimulated emission, leading to pulse laser oscillation with a high intensity and a small pulse width.

The carrier density N_GAIN in the gain region 2a once falls below the transparent carrier density, and then recovers. To prevent regular laser oscillation, the application of V_GAIN is immediately stopped, and V QSW is returned to the base voltage.

To obtain a pulse laser that is stable in both optical output and pulse width, it is necessary to stabilize the timings of V_GAIN and V QSW. It is possible to perform such driving by strictly controlling the mutual phase while driving V_GAIN and V QSW independently of each other with a highly controlled drive circuit. In a case where mass productivity and user-friendliness of the system are considered, however, reductions in costs and size are required. In view of this, a semiconductor laser drive circuit according to this embodiment is now described.

[Semiconductor Laser Drive Circuit According to the First Embodiment]

(Example Circuit Configuration)

Figure 4:
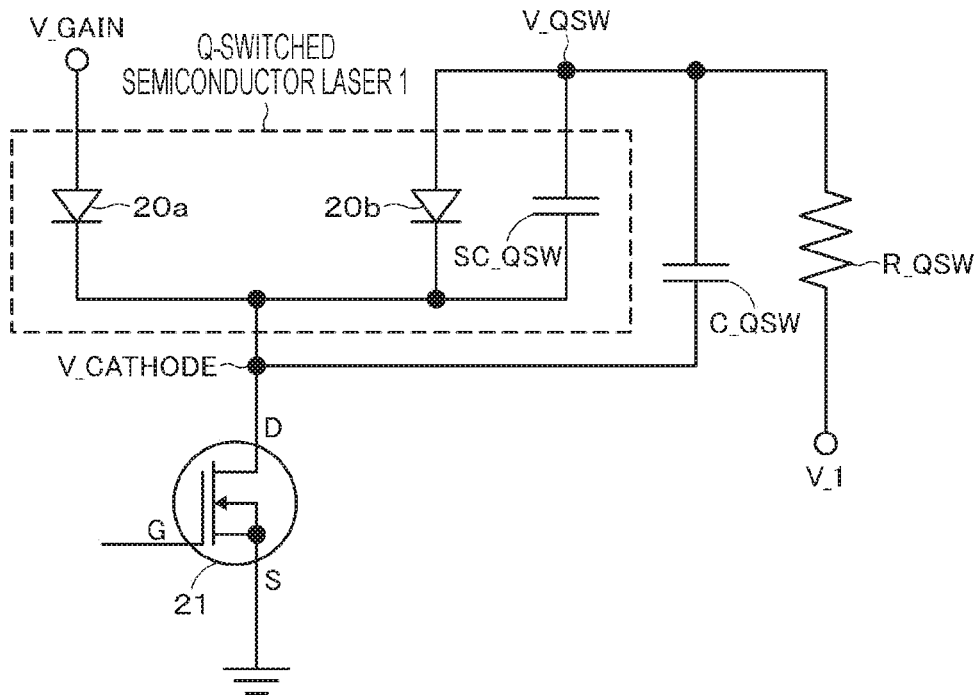
FIG. 4 is a diagram showing an example configuration of a drive circuit that drives a Q-switched semiconductor laser according to a first embodiment.

FIG. 4 shows a simplified equivalent circuit of the semiconductor laser 1 according to the first embodiment. The semiconductor laser 1 according to the first embodiment realizes Q-switch driving of the semiconductor laser 1 only through single switching. Note that Q-switch driving means that causing Q-switched laser oscillation by modulating the light absorption coefficient of the optical region through switching control.

The gain region 20a and the Q-switch region 20b have a common cathode electrode (hereinafter referred to simply as the cathode, where appropriate), and the voltage of the cathode is represented by V_CATHODE. The cathode is connected to the drain (D) of an N-channel metal oxide semiconductor field effect transistor (NMOSFET) 21 (hereinafter referred to simply as the NMOS 21, where appropriate) having its source (S) grounded. Note that, as a switching element, a semiconductor switching element such as a P-channel metal oxide semiconductor field effect transistor (PMOSFET) or a bipolar transistor may be used in place of the NMOS 21, or a mechanical switching element such as a micro electro mechanical system (MEMS) or carbon nanotubes may be used. Accordingly, any form of switching element may be used. As a single switching signal is applied to the gate (G) of the NMOS 21, the cathode is switched from a state of electrically floating above the ground to a grounded state.

The Q-switch region 20b has a parasitic capacitance (a capacitive component) SC_QSW in parallel with a diode formed with a pn junction. SC_QSW depends on the semiconductor layer structure, the waveguide structure, the anode electrode structure, and the like, and can be adjusted with a value of several pF to several tens of pF. Further, an external capacitor C_QSW is connected between the cathode and the anode of the Q-switch region 20b, or specifically, between the midpoint of connection between the anode of the Q-switch region 20b and a resistance R_QSW and the midpoint of connection between the cathode and the NMOS 21. The external capacitor C_QSW is appropriately selected, so that adjustment to a desired capacitance is performed.

Further, a constant voltage source V_1 is connected to the anode electrode (hereinafter referred to simply as the anode, where appropriate) of the Q-switch region 20b, and the resistance R_QSW is connected between the anode and the constant voltage source V_1. The constant voltage source V_1 corresponds to a predetermined potential. Note that the constant voltage source V_1 may be the ground. The time constant τ of the anode in a case where the cathode is at a low potential is defined by the product of the combined capacitance of SC_QSW and C_QSW and the resistance R_QSW. That is, the time constant τ can be set as appropriate.

(Example Operation)

Figure 5:
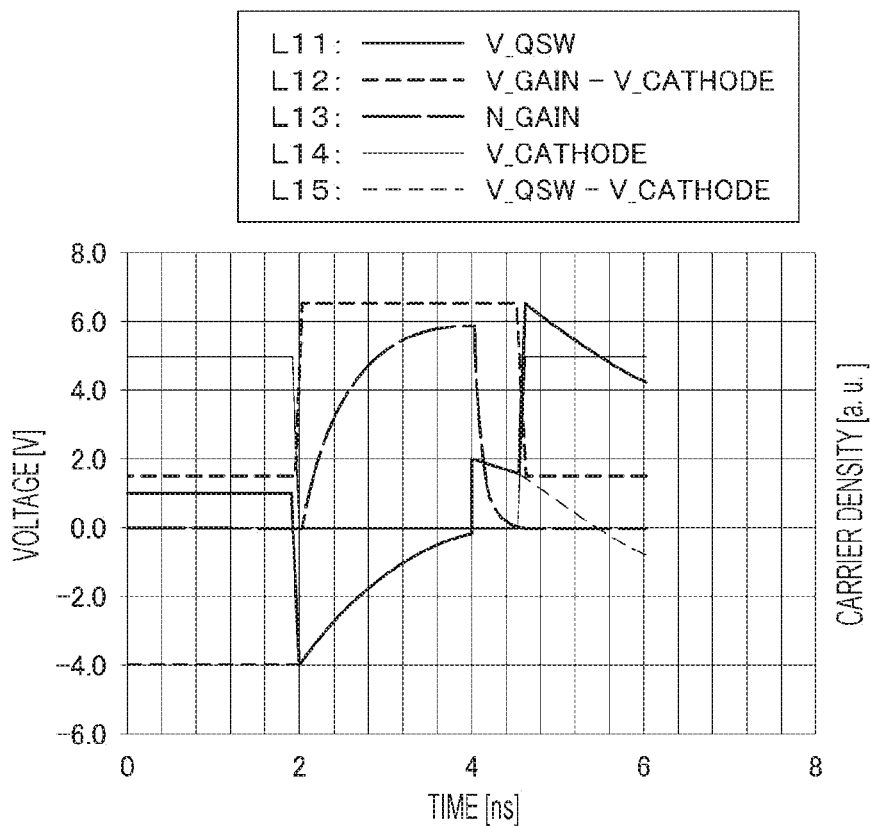
FIG. 5 is a diagram for explaining an example operation of the drive circuit that drives the Q-switched semiconductor laser according to the first embodiment.

Next, an example operation of the semiconductor laser 1 will be described, with reference to the graph shown in FIG. 5. In the graph in FIG. 5, the abscissa axis indicates time (nanosecond (ns)), and the ordinate axis indicates voltage (volt (V)) or carrier density (unit (a.u.)). Further, in the graph in FIG. 5, line L11 represents the temporal change of V QSW, line L12 represents the temporal change of (V_GAIN-V_CATHODE), which is the difference between V_GAIN and the voltage V_CATHODE on the cathode side, line L13 represents the temporal change of the carrier density N_GAIN in the active layer in the gain region 20a, line L14 represents the temporal change of V_CATHODE, and line L15 represents the temporal change of (V QSW-V CATHODE). Note that, in the example operation described below, specific numerical values are used for easier understanding, but the contents of the present disclosure are not limited to the numerical values. Further, the graph in FIG. 5 shows temporal changes of the respective elements within the range necessary for the description of the example operation.

As an example, V_GAIN is connected to a constant voltage source of 6.5 V. When the NMOS 21 is in an off-state, the voltage of V_CATHODE has a value obtained by subtracting the bandgap of the PN junction from V_GAIN, and is 5 V in the case of a PN junction corresponding to a wavelength of 830 nm (1.5 V). If the constant voltage source V_1 is 1 V, a reverse bias of −(negative) 4 V is generated at the PN junction in the Q-switch region 20b.

A pulse is applied to the gate of the NMOS 21, to switch the NMOS 21 to an on-state. V_CATHODE is grounded and becomes 0 V. In a case where the time constant of the NMOS 21 is made sufficiently smaller than the time constant τ of the anode of the Q-switch region 20b, the charge amount of the anode of the Q-switch region 20b cannot follow the change of V_CATHODE, and thus, V_QSW temporarily becomes −4 V. After that, V_QSW recovers toward V_1 in accordance with the time constant τ of the anode. As V_QSW approaches 0 V, the reverse bias at the PN junction of the-Q-switch region 20b is eliminated. When Q-switched laser oscillation occurs due to a decrease in the absorption coefficient of the Q-switch region 20b, V_QSW rapidly increases with photovoltaic power, and then decreases toward V_1 in accordance with the time constant τ of the anode.

When the NMOS 21 is turned off again, V_CATHODE recovers to 5 V, and the charge amount of the anode of the Q-switch region 20b cannot follow the change of V_CATHODE. As a result, V_QSW temporarily becomes slightly higher than 6 V. After that, V_QSW decreases toward V_1 in accordance with the time constant τ of the anode.

That is, in the embodiment of the present disclosure, it is possible to modulate (vary) the laser output of the Q-switched semiconductor laser 1 by switching the NMOS 21. For example, the NMOS 21 is switched, so that the absorption variable of the Q-switch region 20b is modulated, and thus, the laser output is modulated. Specifically, the NMOS 21 is turned on, so that the absorption coefficient of the Q-switch region 20b becomes smaller, to cause laser oscillation. The NMOS 21 is turned off, so that the absorption coefficient of the Q-switch region 20b increases, to restrict laser oscillation.

Note that, for easier understanding of phenomena, the example operation (example driving) of the semiconductor laser 1 described above excludes phenomena and the like in which spontaneous emission light and stimulated emission light from the gain region are absorbed in the Q-switch region to generate photovoltaic power. In an actual system, as the bias of the PN junction in the Q-switch region 20b decreases, the photovoltaic power increases due to the increase in stimulated emission. Accordingly, saturation of transient responses of V_QSW decreases. Because of this photovoltaic power, V_1 may be lower than 1 V or in the neighborhood of 0 V, and even in such cases, Q-switched laser oscillation similarly occurs. Due to the Q-switched laser oscillation, the light intensity preferably becomes higher as the temporal differentiation when V_QSW is 0 V becomes larger, V_1 is preferably slightly lower than the bandgap, and V_GAIN is preferably sufficiently high.

SC_QSW can be adjusted with the electrode area in the Q-switch region 20b, the thickness of the p-type semiconductor, or the thickness of the insulating film between the p-type semiconductor layer and the electrode, for example. C_QSW can be adjusted with an external capacitor, a capacitor formed between the sub-mount cathode pad on which the semiconductor laser is mounted and the sub-mount Q-switch anode pad connected to the anode of the Q switch by wire bonding, or the like. R_QSW can be adjusted with an external capacitor, a thin film resistance formed on a sub-mount, or the like.

[Modification of the First Embodiment]

Figure 6:
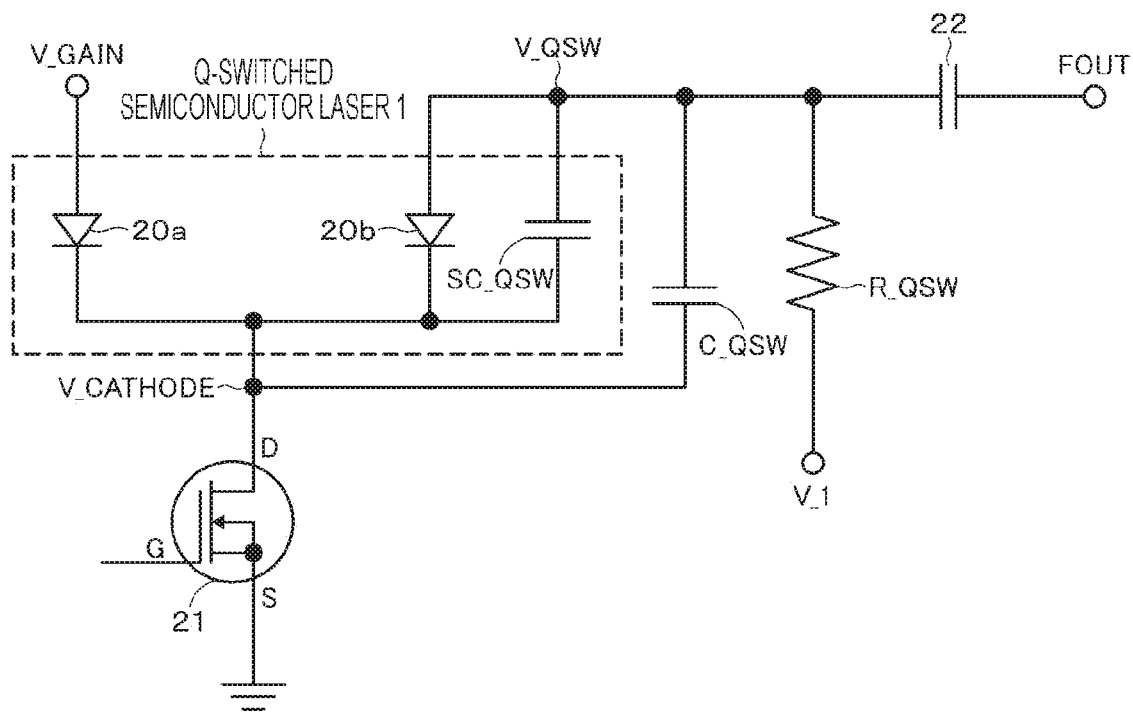
FIG. 6 is a diagram showing a modification of the drive circuit that drives the Q-switched semiconductor laser according to the first embodiment.

The first embodiment may be modified as follows, for example. FIG. 6 shows an example configuration of a drive circuit according to a modification. An output terminal (an electrode) FOUT connected to the anode of the Q-switch region 20b via a C filter 22 may be added to the drive circuit of the semiconductor laser 1 according to the first embodiment. With such a configuration, a differential signal of V_QSW can be output from FOUT. Thus, a steep change in V_QSW due to photovoltaic power at the timing of Q-switched laser oscillation can be observed at FOUT.

The emitted pulse laser and the output from FOUT are synchronized with each other, and can be used as a trigger in a system using this pulse laser, such as a trigger for turning on the NMOS 21, for example. In a case where a pulse signal for driving the Q-switched semiconductor laser, such as a case where the gate voltage of the NMOS 21 is used as a trigger, for example, various fluctuations such as thermal noise in current injection in the semiconductor laser are superimposed, resulting in an increase in system jitter. In a case where a pulse laser is output as a trigger by an external light receiving element, there are problems such as an increase in cost due to additional components, an increase in external size, and an increase in jitter due to fluctuations in the light path. The C filter 22 of FOUT is formed with an external capacitor, a capacitor formed between the sub-mount Q-switch anode pad connected, by wire bonding, to the Q-switch anode of the sub-mount on which the semiconductor laser is mounted and the pad for FOUT, or the like. Alternatively, the anode of the Q-switch region 20*b* and a FOUT electrode having a capacitance may be formed in the semiconductor laser 1.

According to the first embodiment described above, there is no need to perform an operation of single switching, or there is no need to perform sophisticated and strict control, in driving the Q-switched semiconductor laser.

2. Second Embodiment

[Semiconductor Laser Drive Circuit According to Second Embodiment]

(Example Circuit Configuration)

Figure 7:
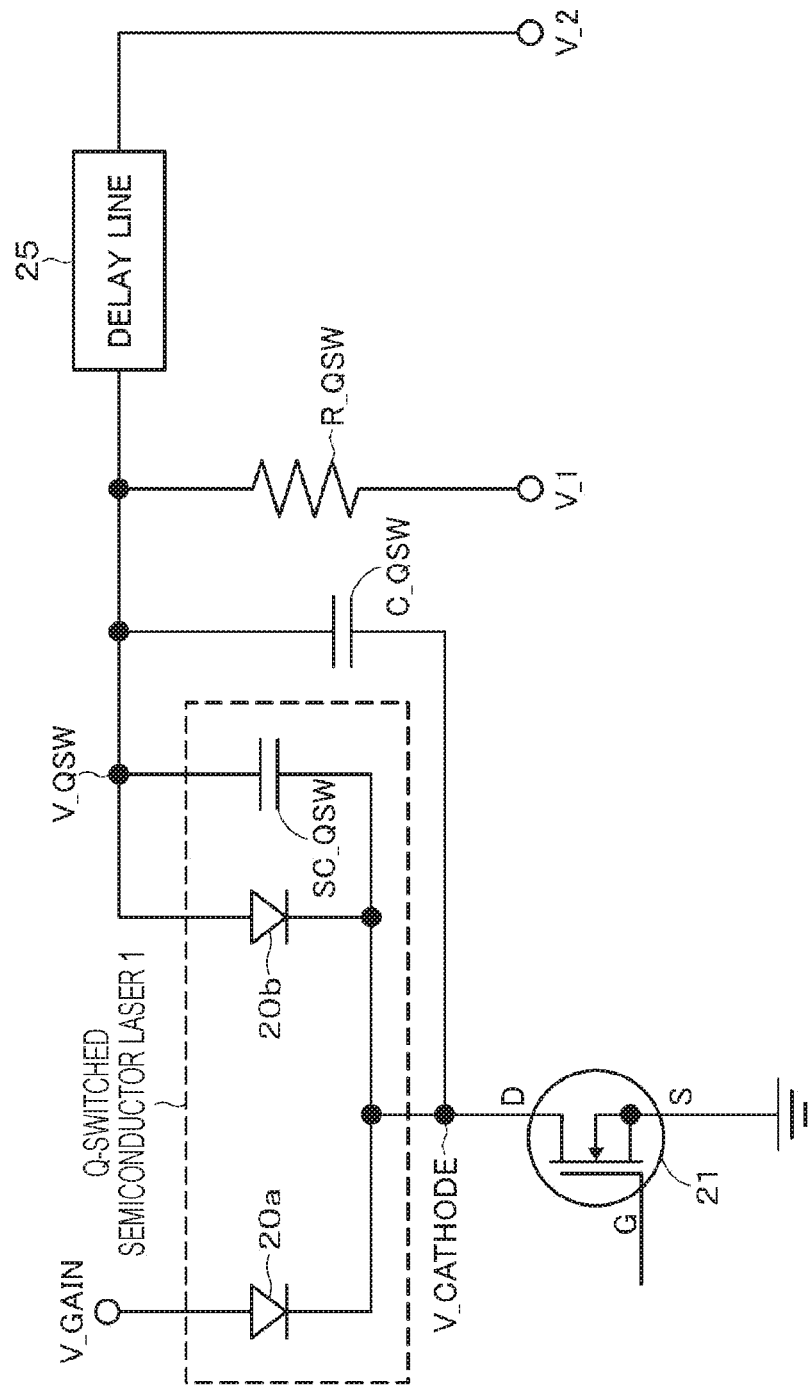
FIG. 7 is a diagram showing an example configuration of a drive circuit that drives a Q-switched semiconductor laser according to a second embodiment.

FIG. 7 shows a simplified equivalent circuit of a semiconductor laser 1 according to a second embodiment. In the circuit configuration of the semiconductor laser according to the second embodiment, Q-switched driving of the semiconductor laser is performed only through single switching. According to the second embodiment, it is possible to obtain a pulse laser with a higher intensity than that in the circuit configuration of the semiconductor laser according to the first embodiment. Note that the matters described in the first embodiment can be applied to the second embodiment unless otherwise specified. Further, like components are denoted by like reference numerals as in the configuration described in the first embodiment, and repetitive explanation will be avoided below.

The gain region 20*a* and the Q-switch region 20*b* have a common cathode, and the voltage of the cathode is represented by V CATHODE. The cathode is connected to the drain of the NMOS 21 having its source grounded. As a single switching signal is applied to the gate of the NMOS 21, the cathode is switched from a state of electrically floating above the ground to a grounded state.

The Q-switch region 20*b* has a parasitic capacitance SC_QSW in parallel with a diode formed with a PN junction. SC_QSW depends on the semiconductor layer structure, the waveguide structure, the anode electrode structure, and the like, and can be adjusted with a value of several pF to several tens of pF. Further, an external capacitor C_QSW is connected between the cathode and the anode of the Q-switch region 20*b*, and the external capacitor C_QSW is appropriately selected, so that desired capacitance adjustment is performed.

A resistance R_QSW is connected between the anode and the constant voltage source V_1. The time constant τ of the anode in a case where the cathode is at a low potential is defined by the product of the combined capacitance of SC_QSW and C_QSW and the resistance R_QSW. That is, the time constant τ can be set at a desired value.

The anode electrode of the Q-switch region 20*b* is connected to one terminal of an impedance-matched delay line (DELAY LINE) 25, and the terminal at the opposite side (the other side) of the delay line 25 is connected to a constant voltage source V_2. The delay line 25 may be an inductor or the like, for example, but is not limited to this. The constant voltage source V_2 corresponds to a predetermined potential. The constant voltage source V_2 may be the ground.

In the description below, a case where V_1 and V_2 are grounded for simplicity will be described. Further, R_QSW is set to 50Ω, and the characteristic impedance of the delay line 25 is also set to 50Ω, for example. The time delay of the delay line 25 is 1 ns. Because the terminal at the opposite side of the delay line 25 is connected directly to the ground, impedance mismatch occurs.

(Example Operation)

As an example, V_GAIN is connected to a constant voltage source of 6.5 V. When the NMOS 21 is in an off-state, the voltage of V_CATHODE has a value obtained by subtracting the bandgap of the PN junction from V_GAIN, and is 5 V in the case of a PN junction corresponding to a wavelength of 830 nm (1.5 V). If the constant voltage source V_1 is the ground, a reverse bias of −(negative) 5 V is generated at the PN junction in the Q-switch region 20*b*.

A pulse is applied to the gate of the NMOS 21, to switch the NMOS 21 to an on-state. V_CATHODE is grounded and becomes 0 V. In a case where the time constant of the NMOS 21 is made sufficiently smaller than the time constant τ of the anode of the Q-switch region 20*b*, the charge amount of the anode of the Q-switch region 20*b* cannot follow the change of V CATHODE, and thus, V_QSW temporarily becomes −5 V. After that, V_QSW recovers toward V_1 (0 V) in accordance with the time constant of the anode. As the relaxation path includes the two paths of R_QSW and the delay line, the time constant τ of the anode is half the time constant τ in a case where the delay line 25 is not provided. Here, the cathode potential of the semiconductor laser 1 is modulated, so that V_QSW is also modulated. The modulation voltage of V_QSW that has passed through the delay line 25 is reflected by the impedance mismatch at the end of the delay line 25, reaches the anode of the Q-switch region 20*b* again, and sharply decreases the absorption coefficient of the Q-switch region 20*b*. As a result, V_QSW rises rapidly at a predetermined timing, and Q-switched laser oscillation occurs. Note that the reflection caused by the impedance mismatch reaches the anode of the Q-switch region 20*b* after the elapse of time that is twice the specific delay time of the delay line 25. In other words, the time t1 corresponding to the difference between the time at which V_QSW rapidly rises and the time at which the same voltage as V_QSW at the time at which V_QSW rapidly rises is generated while the NMOS 21 is in operation is twice the time delay t0 of the delay line 25.

Figure 8:
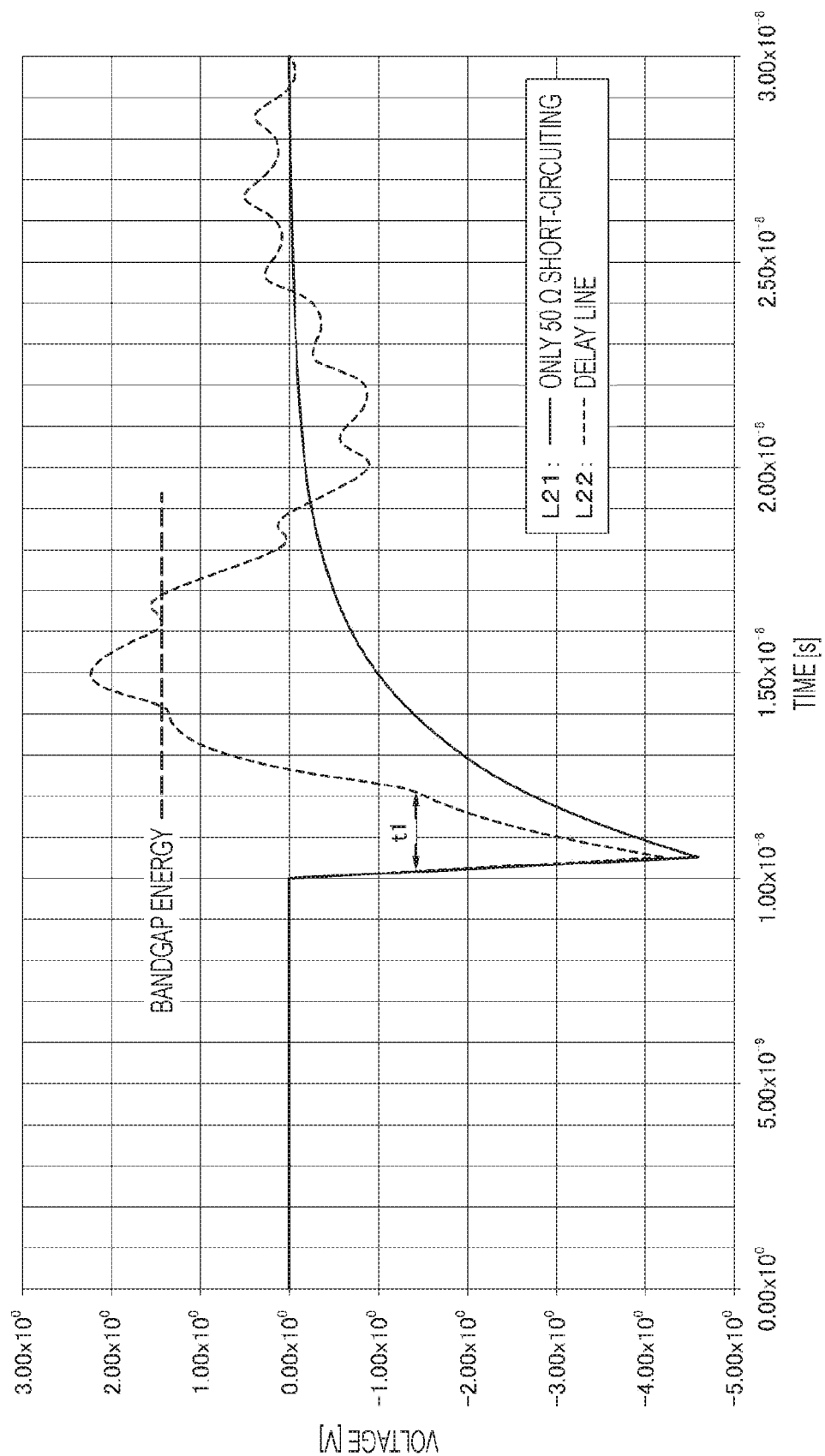
FIG. 8 is a diagram to be referred in explaining an example operation of the drive circuit that drives the Q-switched semiconductor laser according to the second embodiment.

FIG. 8 is a graph showing an example (example results of calculation) of temporal changes of V_QSW. In the graph in FIG. 8, the abscissa axis indicates time (s), and the ordinate axis indicates voltage (V). Further, in FIG. 8, line L21 represents the temporal change of V_QSW in a case where the delay line 25 is not provided in the equivalent circuit shown in FIG. 7, and line L22 represents the temporal change of V_QSW in a case where the delay line 25 is provided in the equivalent circuit shown in FIG. 7, or the temporal change of V_QSW in the equivalent circuit shown in FIG. 7.

In the case where the delay line 25 is provided, V_QSW crosses 0 V very quickly, and might exceed the bandgap. Compared with that in the case where the delay line 25 is not provided, the temporal differentiation at the time when V_QSW crosses 0 V is larger, and a higher-intensity pulse laser is obtained. The oscillation timing can be adjusted stably and easily with the time delay of the delay line 25. Further, the combined capacitance of SC_QSW and C_QSW is changed, so that V_QSW at the timing when the reflected waves due to impedance mismatch at the end of the delay line 25 reach the anode of the Q-switch region 20b can be adjusted. Thus, the oscillation timing and the overshoot voltage can be adjusted. The oscillation timing and the temporal differentiation can also be adjusted by adjusting V_1 and V_2. Therefore, the numerical value of each portion is adjusted as appropriate. Note that, in a case where the propagation loss of the delay line 25 is small, it takes time to attenuate the reflected waves, which might become a noise source in the next pulse oscillation. Therefore, a small resistance may be inserted either before or after the delay line 25 or on both sides.

[First Modification of the Second Embodiment]

Figure 9:
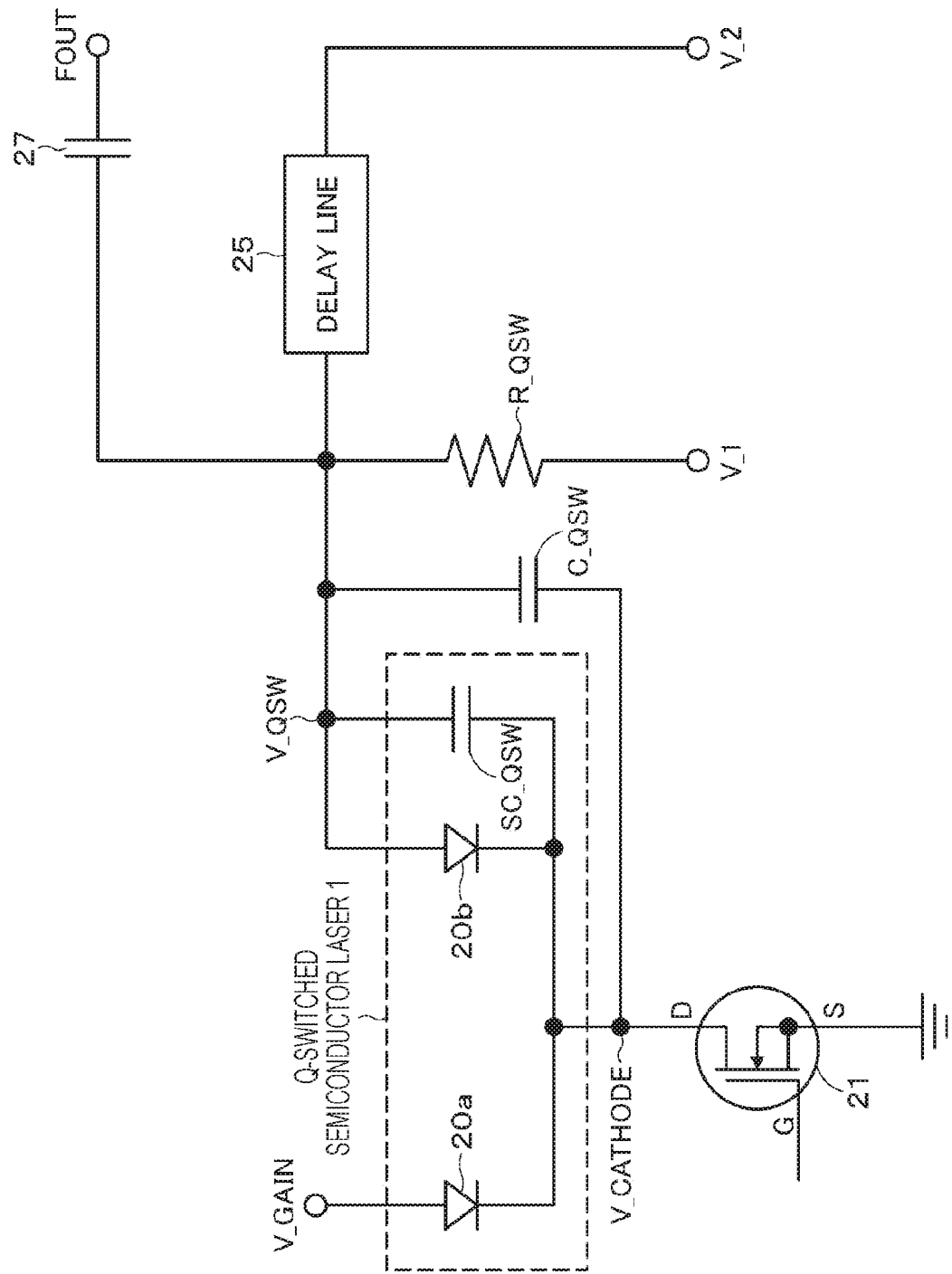
FIG. 9 is a diagram showing a modification of the drive circuit that drives the Q-switched semiconductor laser according to the second embodiment.

FIG. 9 shows an example configuration of a circuit obtained by modifying the drive circuit shown in FIG. 7. In the drive circuit shown in FIG. 9, an output FOUT is added to the anode of the Q-switch region 20b of a semiconductor laser drive circuit via a C filter 27. With such a configuration, a differential signal of V QSW can be output from FOUT. Thus, a steep change in V QSW due to photovoltaic power at the timing of Q-switched laser oscillation can be observed at FOUT.

The emitted pulse laser and the output from FOUT are synchronized with each other, and can be used as a trigger in a system using this pulse laser. In a case where a pulse signal for driving the Q-switched semiconductor laser, such as a case where the gate voltage of the NMOS 21 is used as a trigger, for example, various fluctuations such as thermal noise in current injection in the semiconductor laser are superimposed, resulting in an increase in system jitter. In a case where a pulse laser is output as a trigger by an external light receiving element, there are problems such as an increase in cost due to additional components, an increase in external size, and an increase in jitter due to fluctuations in the light path. The C filter 27 of FOUT is formed with an external capacitor, a capacitor formed between the sub-mount Q-switch anode pad connected, by wire bonding, to the Q-switch anode of the sub-mount on which the semiconductor laser is mounted and the pad for FOUT, or the like. Alternatively, the anode of the Q-switch region 20b and a FOUT electrode having a capacitance may be formed in the semiconductor laser.

[Second Modification of the Second Embodiment]

Figure 10:
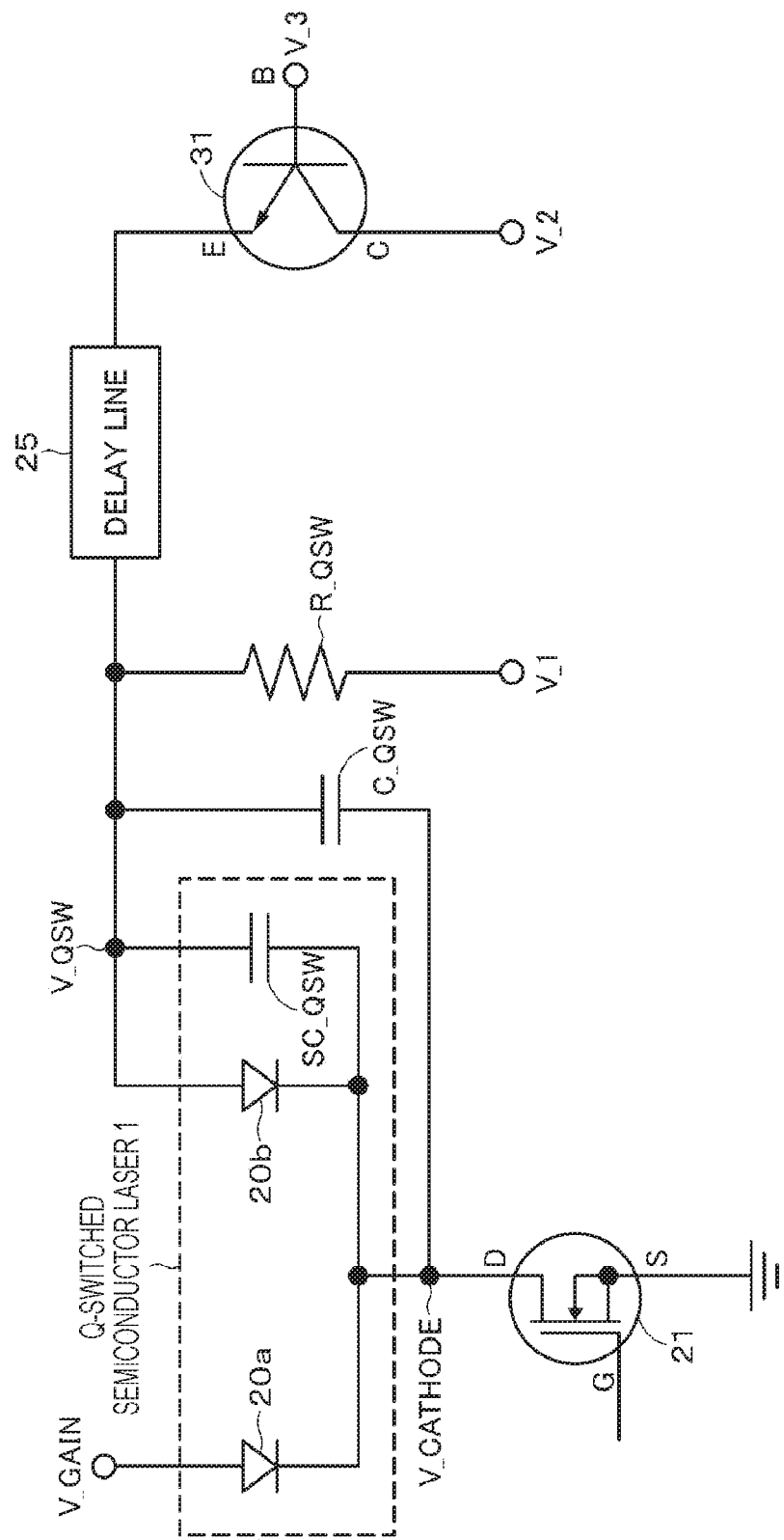
FIG. 10 is a diagram showing a modification of the drive circuit that drives the Q-switched semiconductor laser according to the second embodiment.

FIG. 10 shows an example configuration of a circuit obtained by modifying the drive circuit shown in FIG. 7. In the drive circuit shown in FIG. 10, for example, a bipolar transistor 31 is inserted between the delay line 25 and the constant voltage source V_2 of the semiconductor laser drive circuit according to the second embodiment. Of the terminals on both sides of the delay line 25, the terminal on the opposite side from the anode of the Q-switch region 20b is connected to the emitter (E) of the bipolar transistor 31. The collector (C) of the bipolar transistor 31 is connected to the constant voltage source V_2, and the base (B) is connected to a constant voltage source V_3.

To facilitate understanding, a case where V_1 and V_2 are grounded is now described. The emitter voltage changes due to the modulation voltage of V QSW that has passed through the delay line 25, and conduction is formed between the emitter and the collector when the potential difference from the base reaches a predetermined value. As a result, reflected waves from the collector are generated. When the voltage of the emitter rises, and the potential difference from the base falls below the predetermined value, the emitter-collector conduction becomes off, and reflection decreases.

Figure 11:
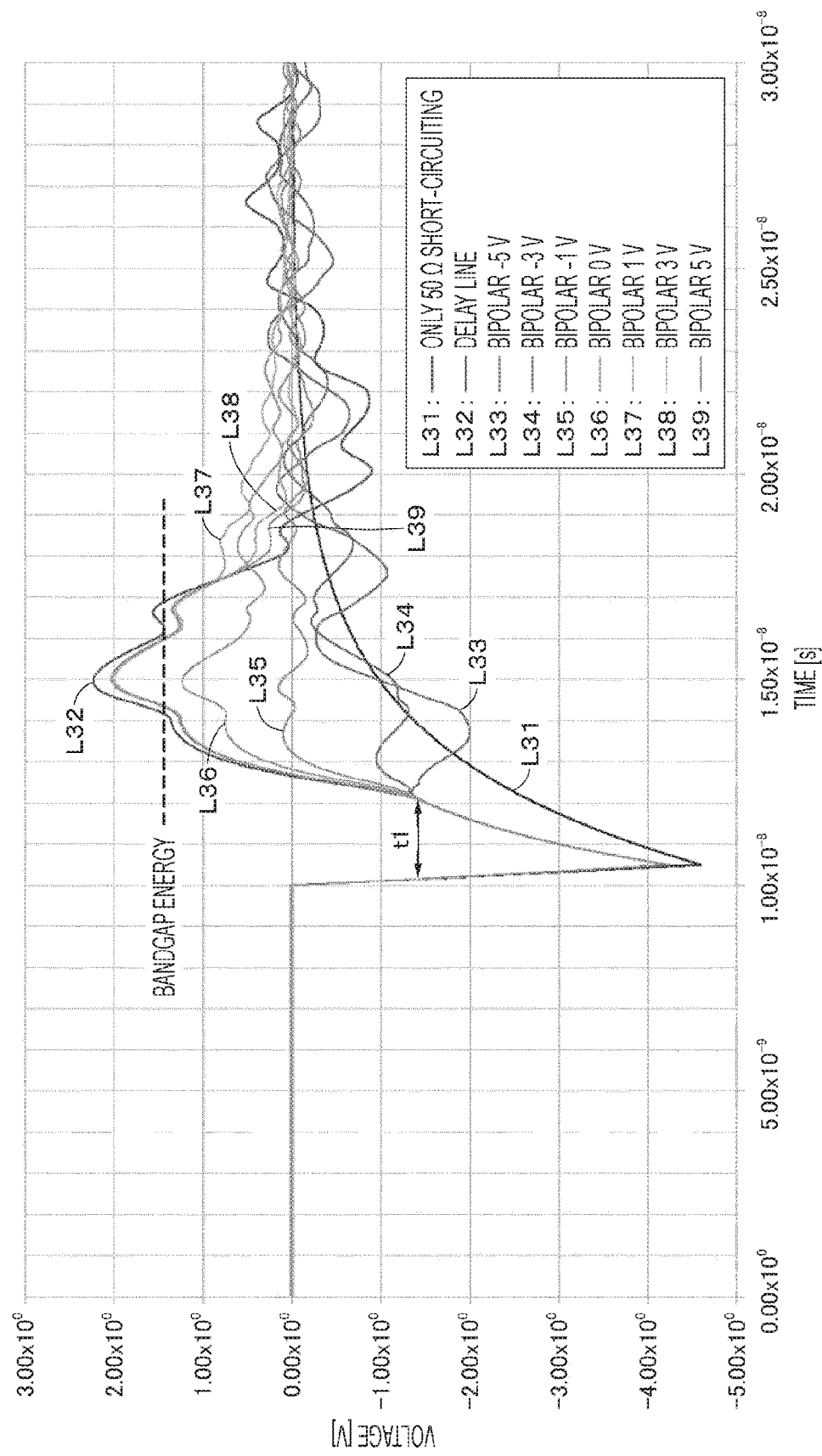
FIG. 11 is a diagram to be referred in explaining an example operation of the drive circuit that drives the Q-switched semiconductor laser according to a modification of the second embodiment.

FIG. 11 is a graph showing an example (example results of calculation) of temporal changes of V QSW. In the graph in FIG. 11, the abscissa axis indicates time (s), and the ordinate axis indicates voltage (V). Further, in FIG. 11, line L31 represents the temporal change of V QSW in a case where the delay line 25 is not provided in the drive circuit shown in FIG. 10, and line L32 represents the temporal change of V QSW in a case where the delay line 25 is provided in the equivalent circuit shown in FIG. 10, or the temporal change of V QSW in the drive circuit shown in FIG. 10. Furthermore, lines L33 through L39 represent temporal changes of V_QSW in a case where the base voltage of bipolar transistor 31 is varied. The line L33 represents an example in which the base voltage is −5 V, the line L34 represents an example in which the base voltage is −3 V, the line L35 represents an example in which the base voltage is −1 V, the line L36 represents an example in which the base voltage is 0 V, the line L37 represents an example in which the base voltage is 1 V, the line L38 represents an example in which the base voltage is 3 V, and the line L39 represents an example in which the base voltage is 5 V.

It can be seen that overshoot is restricted even in some of the cases where the bipolar transistor 31 is inserted and the base voltage is varied, compared with a case where the delay line 25 is provided. In a case where the base voltage is set to −5 V, the bipolar transistor 31 remains OFF, and V_QSW approaches asymptotically to the value that is seen in a case where any delay line is not provided. When the base voltage is −1 V or higher, V_QSW crosses 0 V, and overshoot gradually increases with the rise of the base voltage. As the base voltage is varied in this manner, overshoot can be adjusted. As described above, timing can be adjusted with SC_QSW, C_QSW, or R_QSW, in addition to V_1 and V_2. Note that, in a case where the propagation loss of the delay line is small, it takes time to attenuate the reflected waves, which might become a noise source in the next pulse oscillation. With such a case being taken into consideration, a small resistance may be inserted either before or after the delay line 25 or on both sides.

[Third Modification of the Second Embodiment]

Figure 12:
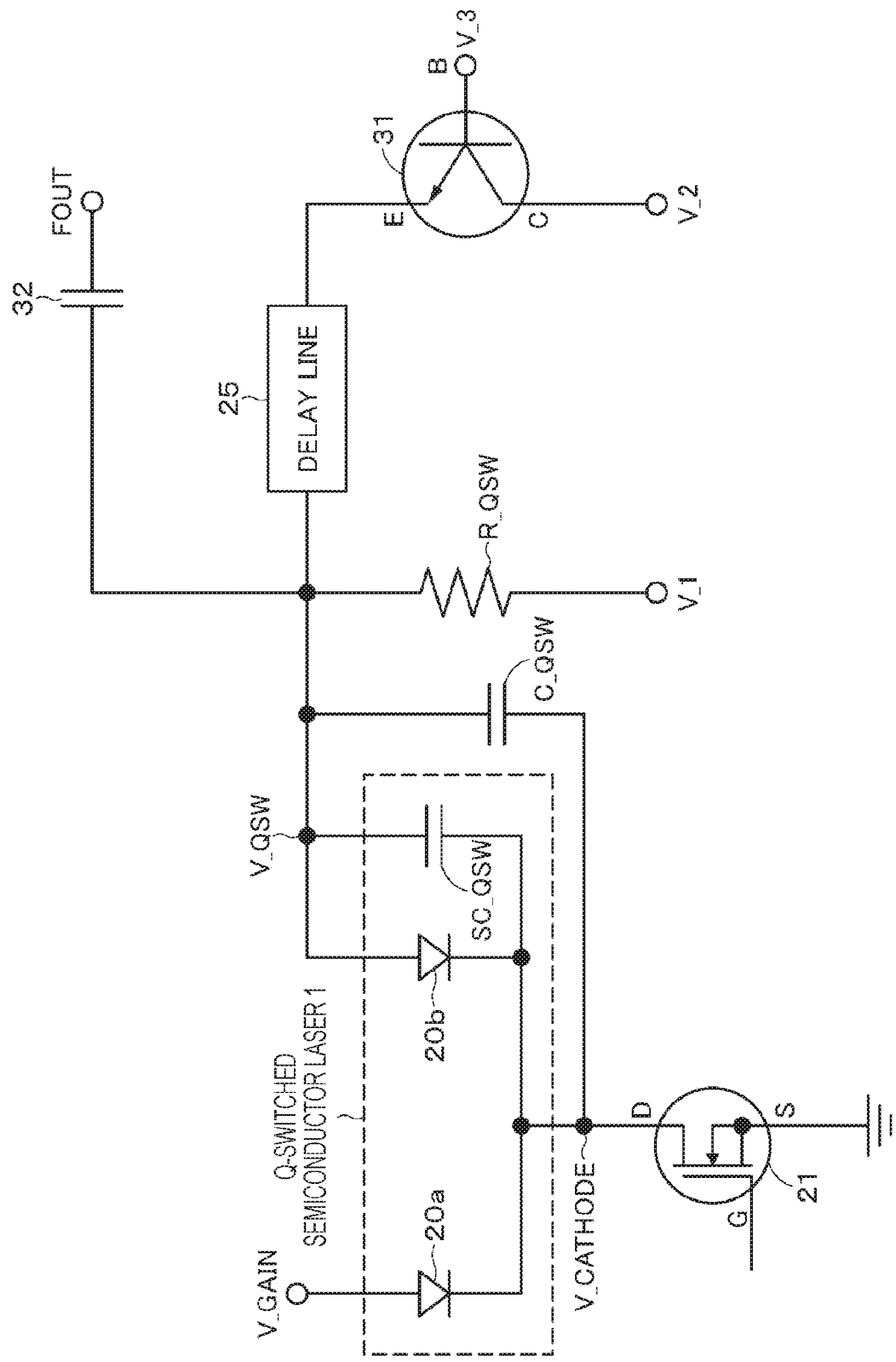
FIG. 12 is a diagram showing a modification of the drive circuit that drives the Q-switched semiconductor laser according to the second embodiment.

FIG. 12 shows an example configuration of a circuit obtained by modifying the drive circuit shown in FIG. 10. In the drive circuit shown in FIG. 12, an output terminal FOUT is added to the anode of the Q-switch region 20b of a semiconductor laser drive circuit via a C filter 32. With such a configuration, a differential signal of V_QSW can be output from FOUT. Thus, a steep change in V_QSW due to photovoltaic power at the timing of Q-switched laser oscillation can be observed at FOUT. The emitted pulse laser and the output from FOUT are synchronized with each other, and can be used as a trigger in a system using this pulse laser. In a case where a pulse signal for driving the Q-switched semiconductor laser, such as a case where the gate voltage of the NMOS 21 is used as a trigger, for example, various fluctuations such as thermal noise in current injection in the semiconductor laser are superimposed, resulting in an increase in system jitter. In a case where a pulse laser is output as a trigger by an external light receiving element, there are problems such as an increase in cost due to additional components, an increase in external size, and an increase in jitter due to fluctuations in the light path. The C filter 32 of FOUT is formed with an external capacitor, a capacitor formed between the sub-mount Q-switch anode pad connected, by wire bonding, to the Q-switch anode of the sub-mount on which the semiconductor laser is mounted and the pad for FOUT, or the like. Alternatively, the anode of the Q-switch region 20b and a FOUT electrode having a capacitance may be formed in the semiconductor laser.

3. Third Embodiment

Figure 13:
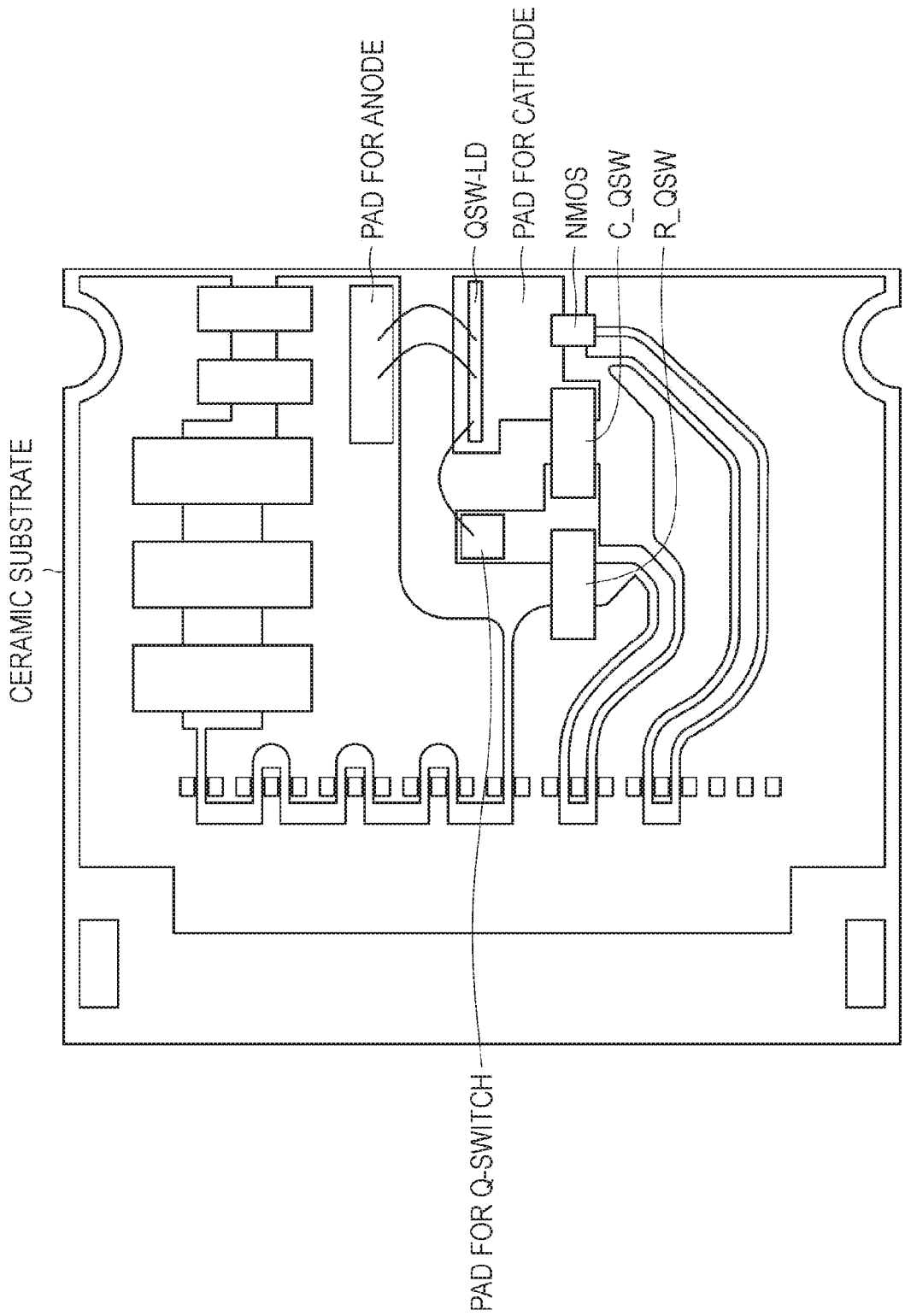
FIG. 13 is a diagram for explaining an example of a housing according to a third embodiment.

A third embodiment is an example of a housing in which a semiconductor laser drive circuit according to any of the above embodiments may be housed. A Q-switched semiconductor laser may be mounted on a ceramic substrate as a housing as shown in FIG. 13, with the P-side facing upward. An NMOS having a large modulation current, and C_QSW and R_QSW for adjusting time constants may also be mounted on the ceramic substrate. In addition to an input signal to the gate of the NMOS, a Q-switch anode line and various constant voltage sources are extended from the ceramic substrate with flexible printed circuits (FPCs) or the like, for example, and the entire structure is covered with a metal casing. Thus, emission of unnecessary radiation can be reduced, and reflection between the NMOS and the cathode can be reduced.

Figure 14A:
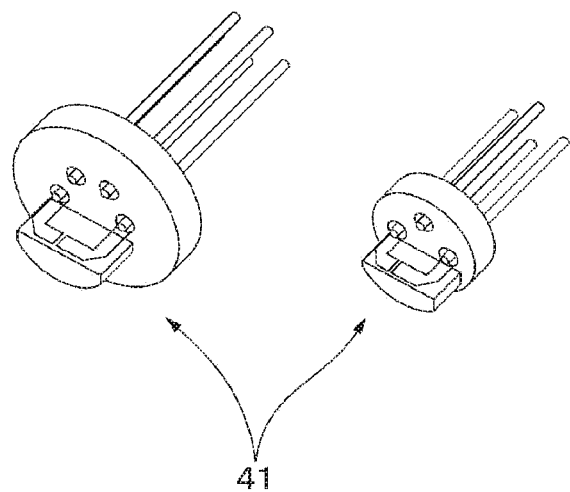
FIGS. 14A and 14B are diagrams for explaining other examples of housings according to the third embodiment.
Figure 14B:
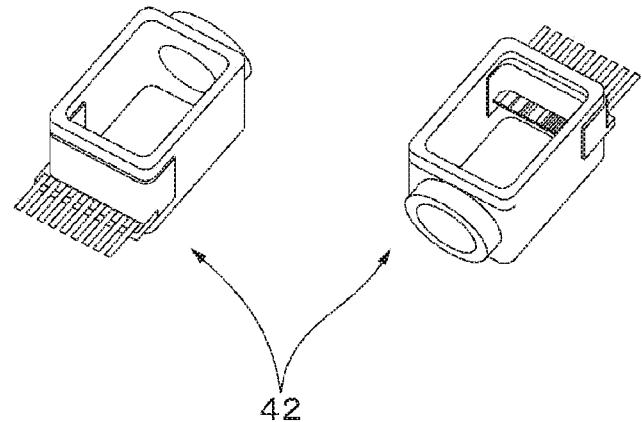

Further, other examples of housings include a housing 41 of a so-called CAN type shown in FIG. 14A, and a box-like housing 42 shown in FIG. 14B. As these housings are capable of housing elements as well as a semiconductor laser, the minimum necessary chips such as an NMOS are disposed in the vicinity of the semiconductor laser, so that the wiring impedance is optimized. Alternatively, the wiring length is designed to be short, so that faster Q-switch driving can be performed. Further, in a case where a semiconductor laser drive circuit is sealed with a housing, unnecessary radiation can be shielded. In a case where a semiconductor laser drive circuit is completely sealed against the outside air, it is necessary to form a window at the laser light irradiation port. The window in this configuration may be formed with an AR (Anti Reflection)-coated glass material or resin material designed in accordance with the wavelength of laser light, or may be a window in which an optical lens is embedded.

Note that, in a semiconductor laser drive circuit of any of the above embodiments, reflection, attenuation, delay, and the like may occur due to the influence of impedance determined by the parasitic capacitance and wiring inductance of the peripheral elements, the frequency band of transmission signals, and the like. Therefore, in a semiconductor laser drive circuit, these influences are taken into consideration in optimizing the elements constituting the circuit and the parameters such as voltage. For example, the delay line is preferably impedance-matched with the peripheral circuits. Meanwhile, the impedance of a delay line is determined by the capacitance and inductance of the delay line. However, the capacitance might play a role similar to that of a bypass capacitor that is used to stabilize a power supply in a general circuit, and hinder voltage changes of V QSW. Also, there is a possibility that an increase in inductance will shut off the high-frequency components of signals, and make the responses blunt. It is also necessary to pay attention to this aspect. In a case where R_QSW is increased at a time constant determined by the combined capacitance of SC-QSW and C-QSW, and R_QSW, the impedance of the delay line needs to be increased, and the above-mentioned problem becomes conspicuous.

4. Fourth Embodiment

A fourth embodiment is an example in which a semiconductor laser device including a semiconductor laser drive circuit according to the present disclosure is applied to a distance measuring apparatus.

(Example Configuration of a Distance Measuring Apparatus)

Figure 15:
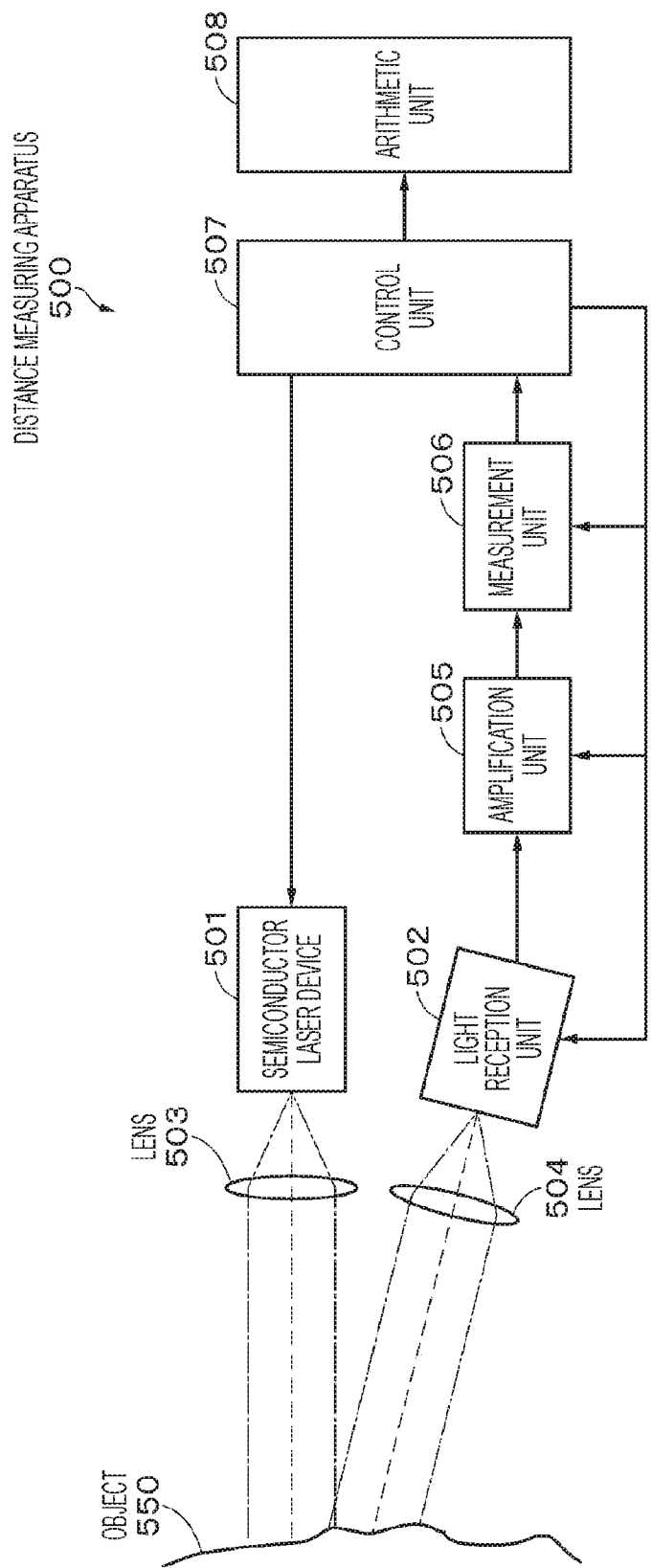
FIG. 15 is a block diagram showing an example configuration of a distance measuring apparatus according to a fourth embodiment.

FIG. 15 schematically shows an example configuration of a distance measuring apparatus (a distance measuring apparatus 500) according to the fourth embodiment. The distance measuring apparatus 500 measures the distance to a subject 550 (the object) by the time-of-flight (TOF) method. The distance measuring apparatus 500 includes a semiconductor laser device 501 as a light source. The semiconductor laser device 501 includes a laser driver that drives a semiconductor laser, and the semiconductor laser drive circuit described above may be applied to the semiconductor laser device 501.

In addition to the semiconductor laser device 501, the distance measuring apparatus 500 also includes a light reception unit 502, lenses 503 and 504, an amplification unit 505, a measurement unit 506, a control unit 507, and an arithmetic unit 508.

The light reception unit 502 detects light reflected by the subject 550. The light reception unit 502 is formed with a photodetector, for example. The light reception unit 502 may be formed with an avalanche photodiode (APD), a single photon avalanche diode (SPAD), a silicon multiplier (SiPM), a multi-pixel single photon avalanche diode (MP-SPAD), or the like.

The lens 503 is a lens for collimating light emitted from the semiconductor laser device 501, and is a collimating lens, for example. The lens 504 is provided for collecting light reflected by the subject 550 and guiding the light to the light reception unit 502.

The amplification unit 505 is an amplifier circuit for amplifying a detection signal output from the light reception unit 502, for example. The measurement unit 506 is a circuit for generating a signal corresponding to the difference between a signal input from the amplification unit 505 and a reference signal, for example. The measurement unit 506 is formed with a time-to-digital converter (TDC), for example. The reference signal may be a signal input from the control unit 507, or may be an output signal from a detector that directly detects an output of the semiconductor laser device 501.

The control unit 507 is a processor that controls the light reception unit 502, the amplification unit 505, and the measurement unit 506, for example. The arithmetic unit 508 is a circuit that acquires distance information on the basis of a signal generated by the measurement unit 506.

The distance measuring apparatus 500 may include a polarization beam splitter (PBS) between a lens and the subject 550, and may also include a reflective mirror that causes light reflected by the PBS to enter the light reception unit 502. In the case of this configuration, light emitted from the semiconductor laser device 501 and light reflected by the subject 550 pass through the same light path between the PBS and the subject 550, so that measurement accuracy becomes higher. An optical system having functions equivalent to those of the PBS can be used in place of the PBS.

The distance measuring apparatus 500 may include, between the lens 503 and the subject 550, a scanning unit that scans light emitted from the semiconductor laser device 501. The scanning unit measures distance information on one axis of the subject 550, or perform two-dimensional measurement, for example. Two-dimensional measurement can be performed by a configuration including the scanning unit. The scanning unit may measure distance information on two axes of the subject 550, or perform three-dimensional measurement, for example. The distance measuring apparatus 500 adopting such a configuration can perform three-dimensional measurement. The distance measuring apparatus 500 may further include a PBS, a reflective mirror, and a scanning unit. In a case where such a configuration is adopted, not only the measurement accuracy can be increased, but also two-dimensional measurement or three-dimensional measurement can be performed. In the distance measuring apparatus 500, the semiconductor laser device 501 is used as the light source. Because of this, high-power laser light can be emitted, and thus, detection accuracy can be increased.

(Example Operation)

An example operation of the distance measuring apparatus 500 is now roughly described. A semiconductor laser (pulsed light) is output from the semiconductor laser device 501 to the subject 550. The pulsed light reflected by the subject 550 is received by the light reception unit 502. The measurement unit 506 measures the light reception timing, such as the timing at which the pulsed light exceeds a predetermined level, for example. For example, the arithmetic unit 508 multiplies the difference between the timing of emission and the timing of reception of the pulsed light by the speed of light, and divides the result by two. By doing so, the arithmetic unit 508 calculates the distance to the subject 550. For such timing of emission, a signal observed at FOUT in the circuit described above may be used as a trigger, or a photodetector may be provided outside. The light intensity is higher, and the pulse width is smaller than in a case where pulse modulation is performed on a conventional semiconductor laser with a drive current, or in a pulsed semiconductor laser using saturable absorption. Thus, the sensitivity in distance measurement becomes higher, and the distance accuracy also becomes higher.

(Electronic Apparatus to which a Ranging Apparatus is Applied)

The distance measuring apparatus 500 of the present disclosure can be formed not only as a single unit, but also as an electronic apparatus systemized with various kinds of devices. Examples of electronic apparatuses are now described.

Figure 16:
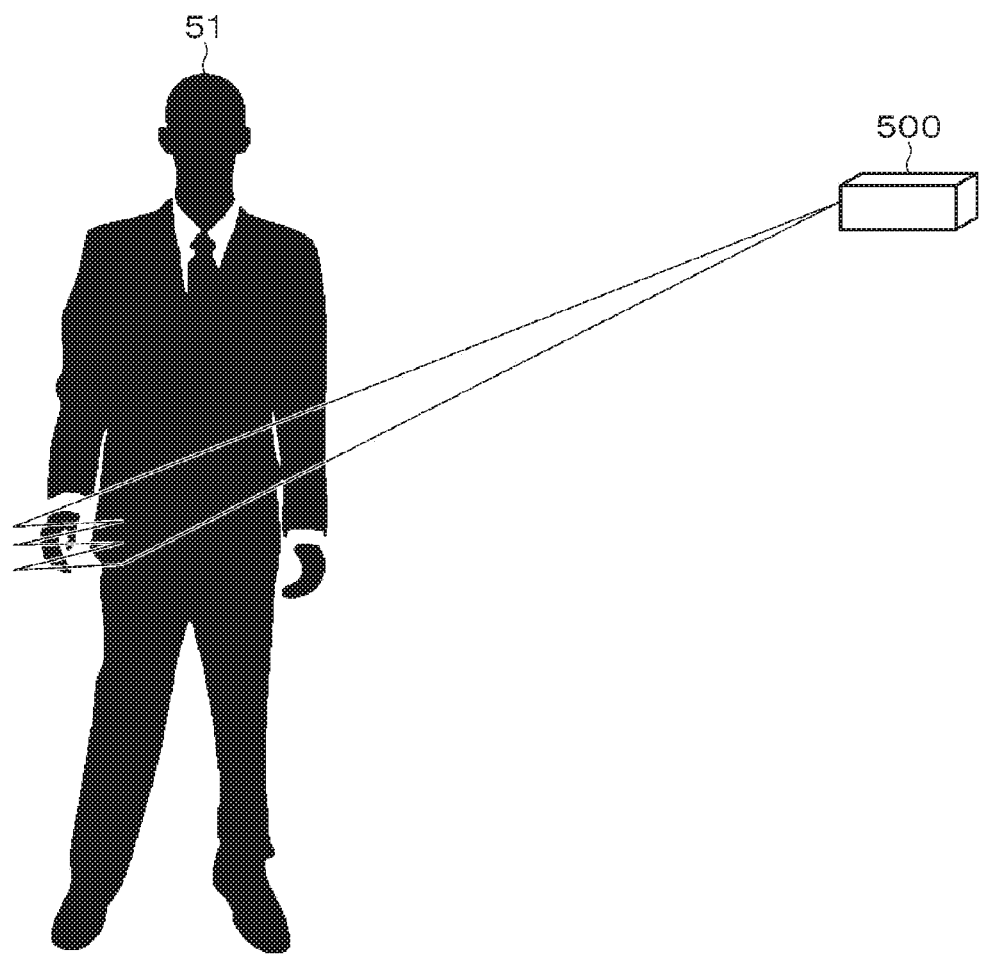
FIG. 16 is a diagram for explaining an example of an electronic apparatus to which the distance measuring apparatus is applied.

FIG. 16 shows an example in which the distance measuring apparatus 500 is applied to a gesture recognition apparatus that is an example electronic apparatus. The distance measuring apparatus 500 measures the distance to a hand of a person 51 in a room, and measures movement of the hand or a finger from a change in the distance, for example. Thus, gesture recognition from a remote location can be performed. The gesture recognition apparatus may of course recognize not only movement of a hand or a finger, but also movement of the face, a foot, or the whole body. Further, a system including a plurality of gesture recognition apparatuses may be used, depending on the recognition target. The gesture recognition apparatus may also recognize motions of an object that is not the person 51. With such a gesture recognition apparatus, it is possible to operate games and various electronic apparatuses, or display augmented reality (AR) on the target person and the surroundings, using a projector apparatus or the like. It is also possible to install the gesture recognition device in a public place, and obtain motions of people as big data.

The distance measuring apparatus 500 may also be applied to a projector apparatus that is another example of an electronic apparatus. Distance measurement is then performed for each point on a wall surface that serves the projection surface, and irregularities of the wall surface are recognized. Depending on the recognized irregularities of the wall surface, a correction process (a contrast improvement process, a color tone improvement process, or the like) may be performed on all or part of the image data of the projected image.

The distance measuring apparatus of the present disclosure may also be applied to a safety apparatus that detects the distance to a pedestrian or an obstacle or the like, and activates a brake in accordance with the distance. In other words, the distance measuring apparatus of the present disclosure may also be applied to a moving object in which such a safety apparatus can be used, such as an automobile, a train, an airplane, a helicopter, or a small flying body. The distance measuring apparatus of the present disclosure may also be applied to a robot (a customer service robot, a disaster rescue robot, a cleaning robot, or the like) or a security system. Such safety apparatuses, moving objects, and security systems also perform electrical processing of some kind, and therefore, are included in the electronic apparatuses described above. Note that specific application examples will be described later.

<5. Modifications>

Although embodiments of the present disclosure have been specifically described so far, the contents of the present disclosure are not limited to the above embodiments, and various changes based on the technical idea of the present disclosure may be made to those embodiments.

For example, the configurations, the methods, the procedures, the shapes, the materials, the numerical values, and the like mentioned in the above described embodiments are merely examples, and configurations, methods, procedures, shapes, materials, numerical values, and the like that differ from those mentioned above may be used as necessary. Further, the matters described in the respective embodiments and modifications may be combined with each other, as long as no technical contradiction occurs.

The present disclosure may also be embodied in the modes described below.

(1)

A semiconductor laser drive circuit including:

an anode electrode divided into at least one gain region and at least one light absorption region;

a cathode electrode shared between the gain region and the light absorption region; and a resistance connected to the anode electrode of the light absorption region.

(2)

The semiconductor laser drive circuit according to (1), in which the resistance is connected to a ground or a constant voltage source.

(3)

The semiconductor laser drive circuit according to (1) or (2), further including a switching element connected between the cathode electrode and a ground.

(4)

The semiconductor laser drive circuit according to (3), in which a capacitor is connected between a midpoint of connection between the anode electrode and the resistance, and a midpoint of connection between the cathode electrode and the switching element.

(5)

The semiconductor laser drive circuit according to any one of (1) to (4), in which the light absorption region has a capacitive component.

(6)

The semiconductor laser drive circuit according to any one of (1) to (5), in which
an output terminal is connected to the anode electrode via a capacitor.

(7)

The semiconductor laser drive circuit according to any one of (1) to (6), further including
a delay line having one terminal connected to the anode electrode.

(8)

The semiconductor laser drive circuit according to (7), in which
the other terminal of the delay line is connected to a ground or a constant voltage source with impedance mismatch.

(9)

The semiconductor laser drive circuit according to (7), in which
an output terminal is connected to the anode electrode via a capacitor.

(10)

The semiconductor laser drive circuit according to (7) or (8), further including
a switching element connected between the delay line and a ground or a constant voltage source.

The semiconductor laser drive circuit according to (10), in which
the switching element is a transistor, the other terminal of the delay line is connected to an emitter of the transistor, and the ground or the constant voltage source is connected to a collector of the transistor.

(12)

A semiconductor laser drive circuit including:
an anode electrode divided into at least one gain region and at least one light absorption region; and
a cathode electrode shared between the gain region and the light absorption region,
in which a switching element connected between the cathode electrode and a ground is turned on or off, to modulate a laser output.

(13)

The semiconductor laser drive circuit according to (12), in which
the switching element is turned on or off, to modulate an absorption coefficient of the light absorption region and modulate the laser output.

(14)

The semiconductor laser drive circuit according to (13), in which
the switching element is turned on to make the absorption coefficient smaller, and the switching element is turned off to make the absorption coefficient greater.

(15)

A method for driving a semiconductor laser drive circuit that includes: an anode electrode divided into at least one gain region and at least one light absorption region; and a cathode electrode shared between the gain region and the light absorption region,
the method including
turning on or off a switching element connected between the cathode electrode and a ground, to modulate a laser output.

(16)

A distance measuring apparatus including:
a semiconductor laser device including the semiconductor laser drive circuit according to any one of (1) to (14);
a light reception unit that receives light reflected by an object that reflects laser light emitted from the semiconductor laser device; and
an arithmetic unit that acquires a distance to the object, on the basis of the timing of emission and the timing of reception of the laser light.

(17)

An electronic apparatus including the distance measuring apparatus according to (16).

<6. Example Applications>

The technology according to the present disclosure may be applied to various products. For example, the technology according to the present disclosure may be embodied as an apparatus mounted on any type of moving object, such as an automobile, an electrical vehicle, a hybrid electrical vehicle, a motorcycle, a bicycle, a personal mobility device, an airplane, a drone, a vessel, a robot, a construction machine, or an agricultural machine (a tractor).

Figure 17:
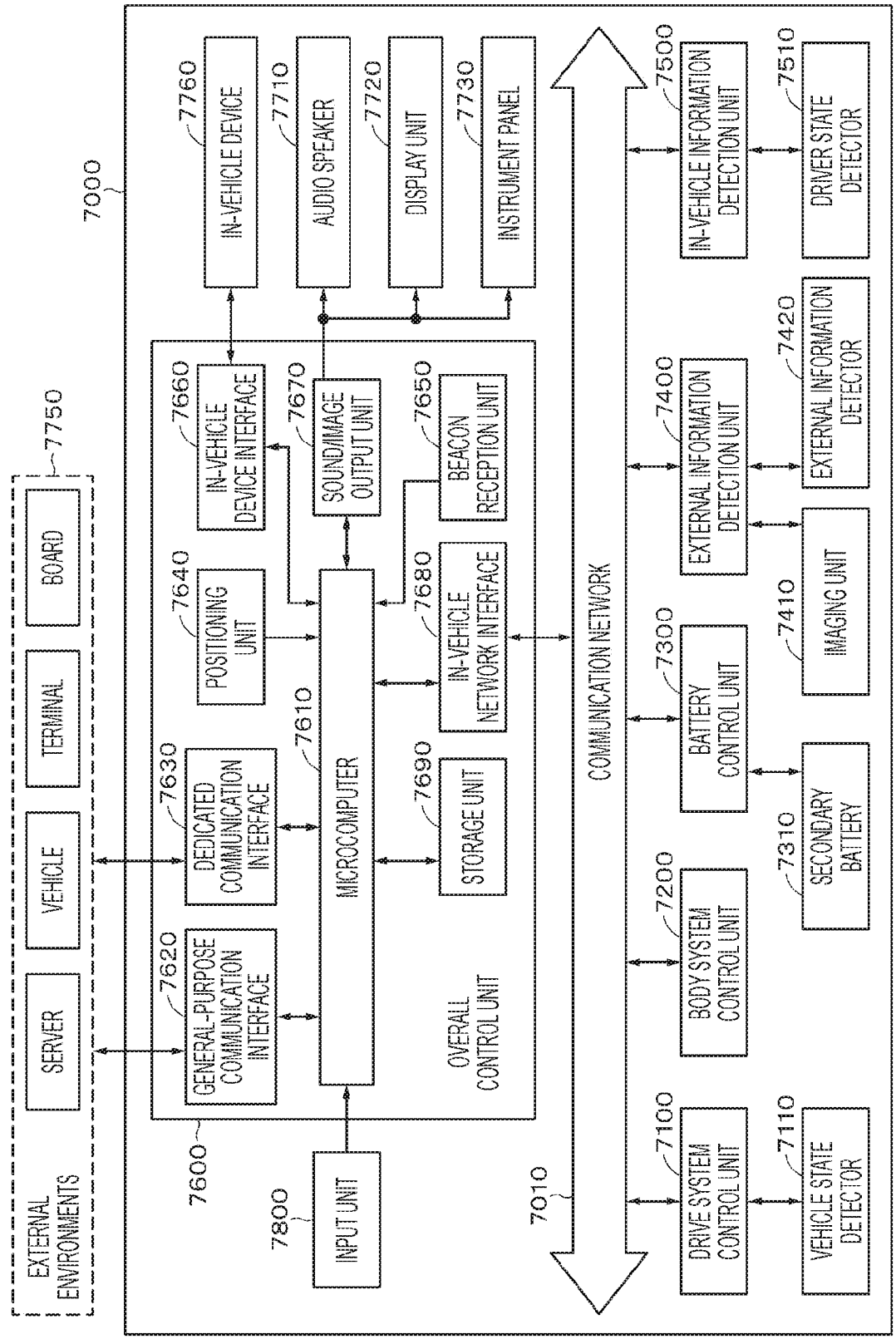
FIG. 17 is a block diagram schematically showing an example configuration of a vehicle control system according to an application example.

FIG. 17 is a block diagram schematically showing an example configuration of a vehicle control system 7000 that is an example of a moving object control system to which the technology according to the present disclosure may be applied. The vehicle control system 7000 includes a plurality of electronic control units connected via a communication network 7010. In the example shown in FIG. 17, the vehicle control system 7000 includes a drive system control unit 7100, a body system control unit 7200, a battery control unit 7300, an external information detection unit 7400, an in-vehicle information detection unit 7500, and an overall control unit 7600. The communication network 7010 connecting the plurality of control units may be an in-vehicle communication network compliant with an appropriate standard, such as a controller area network (CAN), a local interconnect network (LIN), a local area network (LAN), or FlexRay (registered trademark), for example.

Each of the control units includes: a microcomputer that performs arithmetic processing according to various programs; a storage unit that stores the programs to be executed by the microcomputer, the parameters to be used for various calculations, or the like; and a drive circuit that drives the current device to be subjected to various kinds of control. Each of the control units includes a communication interface for performing communication through wired communication or wireless communication with an external device or a sensor or the like, as well as a network interface for communicating with another control unit via the communication network 7010. In FIG. 17, a microcomputer 7610, a general-purpose communication interface 7620, a dedicated communication interface 7630, a positioning unit 7640, a beacon reception unit 7650, an in-vehicle device interface 7660, a sound/image output unit 7670, an in-vehicle network interface 7680, and a storage unit 7690 are shown as the functional components of the overall control unit 7600. Likewise, the other control units each include a microcomputer, a communication interface, a storage unit, and the like.

The drive system control unit 7100 controls operations of the devices related to the drive system of the vehicle according to various programs. For example, the drive system control unit 7100 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle. The drive system control unit 7100 may also have functions as a control device such as an antilock brake system (ABS) or an electronic stability control (ESC).

A vehicle state detector 7110 is connected to the drive system control unit 7100. For example, the vehicle state detector 7110 includes at least one of the following components: a gyroscope sensor that detects an angular velocity of axial rotation motion of the vehicle body; an acceleration sensor that detects an acceleration of the vehicle; and a sensor for detecting an operation amount of the gas pedal, an operation amount of the brake pedal, a steering angle of the steering wheel, an engine rotation speed, a wheel rotation speed, or the like. The drive system control unit 7100 performs arithmetic processing using a signal input from the vehicle state detector 7110, and controls the internal combustion engine, the driving motor, the electrical power steering device, the brake device, or the like.

The body system control unit 7200 controls operations of the various devices mounted on the vehicle body according to various programs. For example, the body system control unit 7200 functions as a keyless entry system, a smart key system, a power window device, or a control device for various lamps such as a headlamp, a backup lamp, a brake lamp, a turn signal lamp, or a fog lamp. In this case, the body system control unit 7200 can receive radio waves transmitted from a portable device that substitutes for a key, or signals from various switches. The body system control unit 7200 receives inputs of these radio waves or signals, and controls the door lock device, the power window device, the lamps, and the like of the vehicle.

The battery control unit 7300 controls a secondary battery 7310 that is a power supply source for the driving motor, according to various programs. For example, the battery control unit 7300 receives information, such as a battery temperature, a battery output voltage, or a remaining capacity of the battery, from a battery device including the secondary battery 7310. The battery control unit 7300 performs arithmetic processing using these signals, to control temperature adjustment of the secondary battery 7310 or to control a cooling device or the like provided in the battery device.

The external information detection unit 7400 detects information outside the vehicle equipped with the vehicle control system 7000. For example, an imaging unit 7410 and/or an external information detector 7420 is connected to the external information detection unit 7400. The imaging unit 7410 includes at least one of the following cameras: a time-of-flight (ToF) camera, a stereo camera, a monocular camera, an infrared camera, or other cameras. The external information detector 7420 includes an environment sensor for detecting the current weather or meteorological phenomenon, and/or an ambient information detection sensor for detecting another vehicle, an obstacle, a pedestrian, or the like around the vehicle equipped with the vehicle control system 7000, for example.

The environment sensor may be formed with at least one of the following sensors: a raindrop sensor that detects rain, a fog sensor that detects a fog, a solar radiation sensor that detects a degree of solar radiation, or a snow sensor that detects a snowfall, for example. The ambient information detection sensor may be at least one of the following devices: an ultrasonic sensor, a radar device, or a light detection and ranging, laser imaging detection and ranging (LIDAR) device. The imaging unit 7410 and the external information detector 7420 may be provided as an independent device and an independent sensor, respectively, or may be provided as a device in which a plurality of sensors or devices is integrated.

Figure 18:
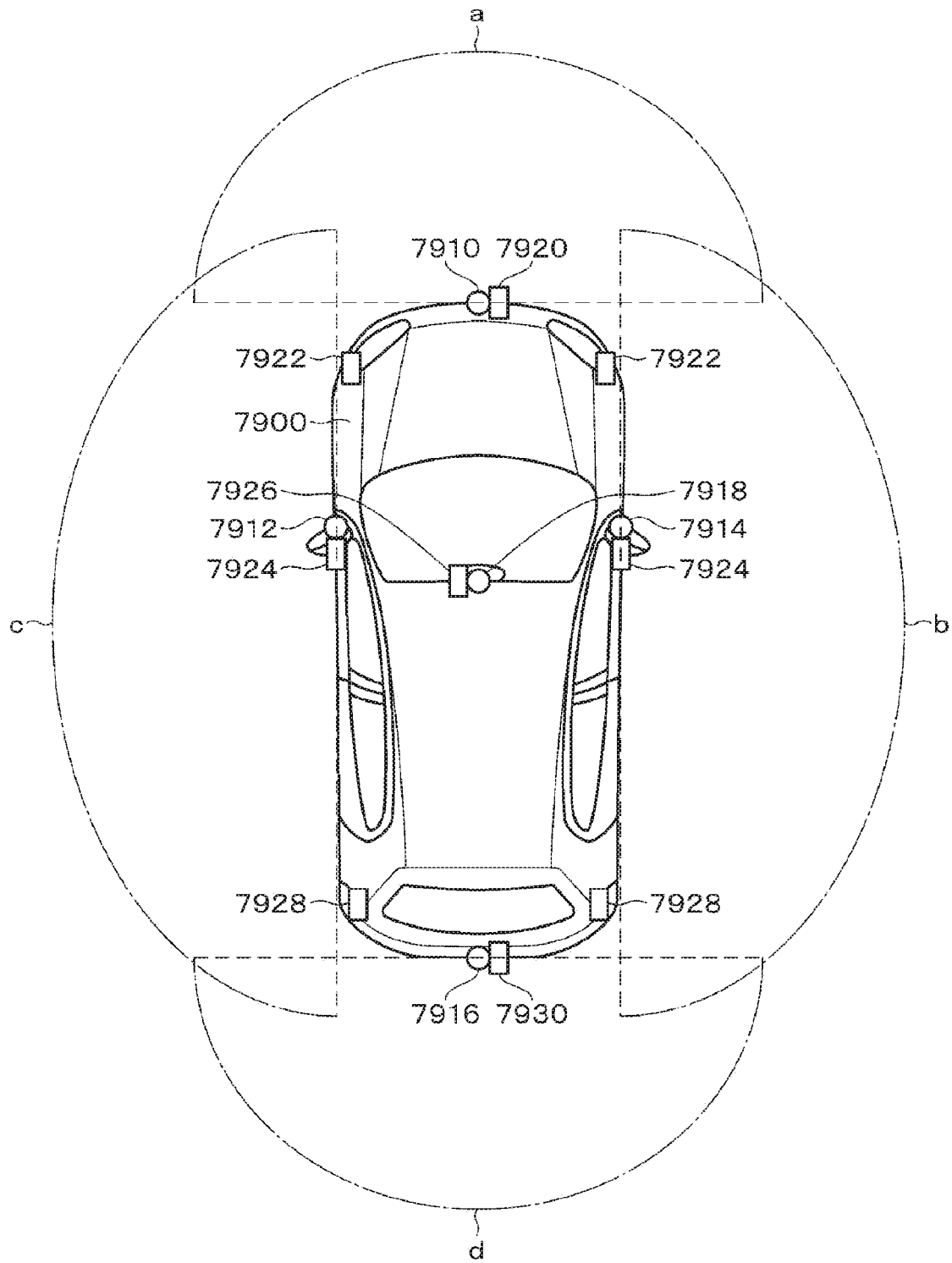
FIG. 18 is an explanatory diagram showing an example of installation positions of external information detectors and imaging units according to an application example.

Here, FIG. 18 shows an example of installation positions of imaging units 7410 and external information detectors 7420. Imaging units 7910, 7912, 7914, 7916, and 7918 are provided at at least one of the following positions: the front end edge of a vehicle 7900, a side mirror, the rear bumper, a rear door, or an upper portion of the front windshield inside the vehicle, for example. The imaging unit 7910 provided on the front end edge and the imaging unit 7918 provided on the upper portion of the front windshield inside the vehicle mainly capture images ahead of the vehicle 7900. The imaging units 7912 and 7914 provided on the side mirrors mainly capture images on the sides of the vehicle 7900. The imaging unit 7916 provided on the rear bumper or a rear door mainly captures images behind the vehicle 7900. The imaging unit 7918 provided on the upper portion of the front windshield inside the vehicle is mainly used for detection of a vehicle running in front of the vehicle, a pedestrian, an obstacle, a traffic signal, a traffic sign, a lane, or the like.

Note that FIG. 18 shows an example of the imaging range of each of the imaging units 7910, 7912, 7914, and 7916. An imaging range a indicates the imaging range of the imaging unit 7910 provided on the front end edge, imaging ranges b and c indicate the imaging ranges of the imaging units 7912 and 7914 provided on the respective side mirrors, and an imaging range d indicates the imaging range of the imaging unit 7916 provided on the rear bumper or a rear door. For example, image data captured by the imaging units 7910, 7912, 7914, and 7916 are superimposed on one another, so that an overhead image of the vehicle 7900 viewed from above is obtained.

External information detectors 7920, 7922, 7924, 7926, 7928, and 7930 provided on the front, the rear, the sides, the corners of the vehicle 7900 and an upper portion of the front windshield inside the vehicle may be ultrasonic sensors or radar devices, for example. The external information detectors 7920, 7926, and 7930 provided on the front end edge of the vehicle 7900, the rear bumper, and the rear doors, and the upper portion of the front windshield inside the vehicle may be LIDAR devices, for example. These external information detectors 7920 through 7930 are mainly used for detecting a vehicle running in front of the vehicle 7900, a pedestrian, an obstacle, or the like.

Referring back to FIG. 17, the explanation is continued. The external information detection unit 7400 causes the imaging unit 7410 to capture an image of the outside of the vehicle, and receives the captured image data. The external information detection unit 7400 also receives detection information from the external information detector 7420 connected thereto. In a case where the external information detector 7420 is an ultrasonic sensor, a radar device, or an LIDAR device, the external information detection unit 7400 causes the external information detector 7420 to transmit ultrasonic waves, or electromagnetic waves, or the like, and receive information about received reflected waves. On the basis of the received information, the external information detection unit 7400 may perform an object detection process for detecting a person, a vehicle, an obstacle, a sign, characters on the road surface, or the like, or perform a distance detection process. On the basis of the received information, the external information detection unit 7400 may also perform an environment recognition process for recognizing a rainfall, a fog, a road surface condition, or the like. On the basis of the received information, the external information detection unit 7400 may also calculate the distance to an object outside the vehicle.

Further, on the basis of the received image data, the external information detection unit 7400 may perform an image recognition process for recognizing a person, a vehicle, an obstacle, a sign, characters on the road surface, or the like, or a distance detection process. The external information detection unit 7400 may also perform processing such as distortion correction or positioning on the received image data, and combine the image data captured by different imaging units 7410, to generate an overhead image or a panoramic image. The external information detection unit 7400 may also perform a viewpoint conversion process using image data captured by different imaging units 7410.

The in-vehicle information detection unit 7500 detects information about the inside of the vehicle. For example, a driver state detector 7510 that detects the state of the driver is connected to the in-vehicle information detection unit 7500. The driver state detector 7510 may include a camera that captures images of the driver, a biometric sensor that detects biological information about the driver, a microphone that collects sounds inside the vehicle, or the like. The biometric sensor is provided on the seating surface or the steering wheel or the like, for example, and detects biological information about a passenger sitting on a seat or the driver holding the steering wheel. On the basis of the detection information input from the driver state detector 7510, the in-vehicle information detection unit 7500 may calculate the degree of fatigue or the degree of concentration of the driver, or determine whether the driver is dozing off. The in-vehicle information detection unit 7500 may also perform a noise cancel process or the like on the collected sound signals.

The overall control unit 7600 controls the entire operation in the vehicle control system 7000 according to various programs. An input unit 7800 is connected to the overall control unit 7600. The input unit 7800 is formed with a device on which a passenger can perform an input operation, such as a touch panel, buttons, a microphone, a switch, or a lever, for example. The overall control unit 7600 may receive data obtained by performing speech recognition on sound input through a microphone. For example, the input unit 7800 may be a remote control device using infrared rays or some other radio waves, or an external connection device such as a portable telephone or a personal digital assistant (PDA) compatible with operations on the vehicle control system 7000. The input unit 7800 may be a camera, for example, and in that case, a passenger can input information by gesture. Alternatively, data obtained by detecting movement of a wearable device worn by a passenger may be input. Further, the input unit 7800 may include an input control circuit or the like that generates an input signal on the basis of information input by a passenger or the like using the above input unit 7800, for example, and outputs the input signal to the overall control unit 7600. By operating this input unit 7800, a passenger or the like inputs various data to the vehicle control system 7000 or issues a processing operation instruction to the vehicle control system 7000.

The storage unit 7690 may include a read only memory (ROM) that stores various programs to be executed by the microcomputer, and a random access memory (RAM) that stores various parameters, calculation results, sensor values, and the like. Also, the storage unit 7690 may be formed with a magnetic storage device such as a hard disc drive (HDD), a semiconductor storage device, an optical storage device, a magneto-optical storage device, or the like.

The general-purpose communication interface 7620 is a general communication interface that mediates communication with various devices existing in external environments 7750. The general-purpose communication interface 7620 may implement a cellular communication protocol such as global system of mobile communications (GSM) (registered trademark), WiMAX, long term evolution (LTE), or LTE-Advanced (LTE-A), or some other wireless communication protocol such as wireless LAN (also called Wi-Fi (registered trademark)) or Bluetooth (registered trademark). The general-purpose communication interface 7620 may be connected to a device (an application server or a control server, for example) existing in an external network (the Internet, a cloud network, or a company-specific network, for example) via a base station or an access point, for example. Alternatively, the general-purpose communication interface 7620 may be connected to a terminal (a terminal of a driver, a pedestrian, or a shop, or a machine type communication (MTC) terminal, for example) existing in the vicinity of the vehicle, using the peer-to-peer (P2P) technology, for example.

The dedicated communication interface 7630 is a communication interface that supports a communication protocol formulated for use in a vehicle. The dedicated communication interface 7630 may implement a standard protocol such as Wireless Access in Vehicle Environment (WAVE), which is a combination of IEEE802.11p as the lower layer and IEE16609 as the upper layer, Dedicated Short Range Communications (DSRC), or a cellular communication protocol, for example. Typically, the dedicated communication interface 7630 conducts V2X communication, which is a concept including at least one of the following kinds of communication: vehicle-to-vehicle communication, vehicle-to-infrastructure communication, vehicle-to-home communication, and vehicle-to-pedestrian communication.

The positioning unit 7640 receives a GNSS signal (a GPS signal from a global positioning system (GPS) satellite, for example) from a global navigation satellite system (GNSS) satellite, performs positioning, and generates location information including the latitude, the longitude, and the altitude of the vehicle, for example. It should be noted that the positioning unit 7640 may identify the current location by exchanging signals with a wireless access point, or may acquire the location information from a terminal having a positioning function, such as a portable telephone, a PHS, or a smartphone.

The beacon reception unit 7650 receives radio waves or electromagnetic waves transmitted from a wireless station or the like installed on a road, for example, and acquires information about the current location, traffic congestion, closing of a road, a required time, or the like. Note that the functions of the beacon reception unit 7650 may be included in the dedicated communication interface 7630 described above.

The in-vehicle device interface 7660 is a communication interface that mediates connection between the microcomputer 7610 and various in-vehicle devices 7760 existing in the vehicle. The in-vehicle device interface 7660 may establish a wireless connection, using a wireless communication protocol such as wireless LAN, Bluetooth (registered trademark), Near Field Communication (NFC), or wireless USB (WUSB). Further, the in-vehicle device interface 7660 may establish a wired connection to a universal serial bus (USB), a high-definition multimedia interface (HDMI) (registered trademark), a mobile high-definition link (MHL) (registered trademark), or the like via a connecting terminal (not shown) (and a cable, if necessary). The in-vehicle devices 7760 may include a mobile device or a wearable device owned by a passenger, and/or an information device installed in or attached to the vehicle, for example. The in-vehicle devices 7760 may also include a navigation device that searches for a route to a desired destination. The in-vehicle device interface 7660 exchanges control signals or data signals with these in-vehicle devices 7760.

The in-vehicle network interface 7680 is an interface that mediates communication between the microcomputer 7610 and the communication network 7010. The in-vehicle network interface 7680 transmits and receives signals and the like, according to a predetermined protocol supported by the communication network 7010.

The microcomputer 7610 of the overall control unit 7600 controls the vehicle control system 7000 according to various programs, following information acquired via at least one of the following components: the general-purpose communication interface 7620, the dedicated communication interface 7630, the positioning unit 7640, the beacon reception unit 7650, the in-vehicle device interface 7660, and the in-vehicle network interface 7680. For example, on the basis of acquired external and internal information, the microcomputer 7610 may calculate the control target value of the driving force generation device, the steering mechanism, or the braking device, and output a control command to the drive system control unit 7100. For example, the microcomputer 7610 may perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like. The microcomputer 7610 may also perform cooperative control to conduct automatic driving or the like for autonomously running not depending on the operation of the driver, by controlling the driving force generation device, the steering mechanism, the braking device, or the like on the basis of acquired information about the surroundings of the vehicle.

The microcomputer 7610 may generate information about the three-dimensional distance between the vehicle and an object such as a nearby architectural structure or a person, and create local map information including surroundings information about the current location of the vehicle, on the basis of information acquired via at least one of the following components: the general-purpose communication interface 7620, the dedicated communication interface 7630, the positioning unit 7640, the beacon reception unit 7650, the in-vehicle device interface 7660, and the in-vehicle network interface 7680. The microcomputer 7610 may also generate a warning signal by predicting danger such as a collision of the vehicle, an approach of a pedestrian or the like, or entry to a closed road, on the basis of acquired information. The warning signal may be a signal for generating an alarm sound or for turning on a warning lamp, for example.

The sound/image output unit 7670 transmits an audio output signal and/or an image output signal to an output device that is capable of visually or audibly notifying the passenger(s) of the vehicle or the outside of the vehicle of information. In the example shown in FIG. 17, an audio speaker 7710, a display unit 7720, and an instrument panel 7730 are shown as examples of output devices. The display unit 7720 may include an on-board display and/or a head-up display, for example. The display unit 7720 may have an augmented reality (AR) display function. An output device may be some device other than the above devices, such as a wearable device like a headphone or an eyeglass-type display to be worn by a passenger, a projector, or a lamp. In a case where the output device is a display device, the display device visually displays results obtained through various processes performed by the microcomputer 7610, or information received from other control units, in various forms such as text, an image, a table, or a graph. Further, in a case where the output device is a sound output device, the sound output device converts an audio signal formed with reproduced sound data, acoustic data, or the like into an analog signal, and audibly outputs the analog signal.

Note that, in the example shown in FIG. 17, at least two control units connected via the communication network 7010 may be integrated into one control unit. Alternatively, each control unit may be formed with a plurality of control units. Further, the vehicle control system 7000 may include another control unit that is not shown in the drawing. Also, in the above description, some or all of the functions of one of the control units may be provided by some other control unit. That is, as long as information is transmitted and received via the communication network 7010, predetermined arithmetic processing may be performed by any control unit. Likewise, a sensor or a device connected to any control unit may be connected to another control unit, and a plurality of control units may transmit and receive detection information to and from one another via the communication network 7010.

Note that the configuration, the functions, and the like of the semiconductor laser drive circuit or the distance measuring apparatus including a semiconductor laser drive may be applied to the external information detection unit 7400, for example.

REFERENCE SIGNS LIST

1 Q-switched semiconductor laser
20a Gain region
20b Q-switch region (light absorption region)
21 NMOS
22 Capacitor
25 Delay line
27 Capacitor
31 Transistor
500 Distance measuring apparatus
501 Semiconductor laser device
502 Light reception unit
508 Arithmetic unit

The invention claimed is:

1. A semiconductor laser drive circuit, comprising:
an anode electrode divided into at least one gain region and at least one light absorption region;
a cathode electrode shared between the gain region and the light absorption region;
a resistance connected to the anode electrode of the light absorption region;
a delay line having a first terminal directly connected to the anode electrode; and
a first switching element connected between the delay line and a ground or a constant voltage source, wherein
the first switching element is a transistor,
a second terminal of the delay line is directly connected to an emitter of the transistor, and
the ground or the constant voltage source is connected to a collector of the transistor.

2. The semiconductor laser drive circuit according to claim 1, wherein
the resistance is connected to the ground or an additional constant voltage source.

3. The semiconductor laser drive circuit according to claim 1,
wherein a second switching element is connected between the cathode electrode and the ground.

4. The semiconductor laser drive circuit according to claim 3, wherein
a capacitor is connected between a point of connection between the anode electrode and the resistance, and a point of connection between the cathode electrode and the second switching element.

5. The semiconductor laser drive circuit according to claim 1, wherein
the light absorption region has a parasitic capacitive component in parallel with a diode.

6. The semiconductor laser drive circuit according to claim 1, wherein
an output terminal is connected to the anode electrode via a capacitor.

7. A distance measuring apparatus, comprising:
a semiconductor laser device including the semiconductor laser drive circuit according to claim 1;
a light reception unit configured to receive light reflected by an object that reflects laser light emitted from the semiconductor laser device; and
an arithmetic unit configured to acquire a distance to the object, based on a basis of a timing of emission and a timing of reception of the laser light.

8. An electronic apparatus including the distance measuring apparatus according to claim 7.

9. A semiconductor laser drive circuit, comprising:
an anode electrode divided into at least one gain region and at least one light absorption region;
a cathode electrode shared between the gain region and the light absorption region,
a delay line having a first terminal connected to the anode electrode; and
a first switching element connected between the delay line and a ground or a constant voltage source, wherein
the first switching element is a transistor,
a second terminal of the delay line is connected to an emitter of the transistor, and
the ground or the constant voltage source is connected to a collector of the transistor, wherein a second switching element connected between the cathode electrode and the ground is turned on or off, to modulate a laser output.

10. The semiconductor laser drive circuit according to claim 9, wherein
the second switching element is turned on or off, to modulate an absorption coefficient of the light absorption region to modulate a laser output.

11. The semiconductor laser drive circuit according to claim 10, wherein
the second switching element is turned on to make the absorption coefficient smaller, and the second switching element is turned off to make the absorption coefficient greater.

12. A method for driving a semiconductor laser drive circuit that includes:
an anode electrode divided into at least one gain region and at least one light absorption region;
a cathode electrode shared between the gain region and the light absorption region;
a delay line having a first terminal connected to the anode electrode; and
a first switching element connected between the delay line and a ground or a constant voltage source, the method comprising:
turning on or off a second switching element connected between the cathode electrode and the ground, to modulate a laser output, wherein
the first switching element is a transistor,
a second terminal of the delay line is connected to an emitter of the transistor, and
the ground or the constant voltage source is connected to a collector of the transistor.

* * * * *